(12) United States Patent
Ahlawat

(10) Patent No.: US 10,816,905 B2
(45) Date of Patent: Oct. 27, 2020

(54) WAVELENGTH STABILIZATION FOR AN OPTICAL SOURCE

(71) Applicant: Cymer, LLC, San Diego, CA (US)

(72) Inventor: Rahul Ahlawat, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 499 days.

(21) Appl. No.: 14/681,675

(22) Filed: Apr. 8, 2015

(65) Prior Publication Data

US 2016/0299441 A1 Oct. 13, 2016

(51) Int. Cl.
| | |
|---|---|
| *H01S 3/137* | (2006.01) |
| *H01S 3/13* | (2006.01) |
| *G03F 7/20* | (2006.01) |
| *H01S 3/0971* | (2006.01) |

(52) U.S. Cl.
CPC ...... *G03F 7/70575* (2013.01); *G03F 7/70041* (2013.01); *H01S 3/137* (2013.01); *H01S 3/0971* (2013.01); *H01S 3/1305* (2013.01)

(58) Field of Classification Search
CPC .................................................. G03F 7/70575
See application file for complete search history.

(56) References Cited

U.S. PATENT DOCUMENTS

| | | | |
|---|---|---|---|
| 5,473,409 A * | 12/1995 | Takeda | G03F 7/70575 355/53 |
| 5,978,405 A | 11/1999 | Juhasz | |
| 6,005,879 A | 12/1999 | Sandstrom | |
| 6,078,599 A | 6/2000 | Everage et al. | |
| 6,735,225 B2 | 5/2004 | Albrecht et al. | |
| 8,254,420 B2 | 8/2012 | Riggs | |
| 2002/0006149 A1 | 1/2002 | Spangler et al. | |

(Continued)

FOREIGN PATENT DOCUMENTS

| | | |
|---|---|---|
| JP | H07094389 A | 4/1995 |
| JP | 2001257406 A | 9/2001 |

(Continued)

OTHER PUBLICATIONS

D. A. Bristow, M. Tharayil, A. G. Alleyne, "A Survey of Iterative Learning Control", Control Systems Magazine, IEEE, vol. 26, No. 3. (Jun. 2006), pp. 96-114.

(Continued)

*Primary Examiner* — Xinning(Tom) Niu
*Assistant Examiner* — Sean P Hagan
(74) *Attorney, Agent, or Firm* — DiBerardino McGovern IP Group LLC

(57) ABSTRACT

A wavelength error for each pulse in a first subset of pulses emitted from an optical source is determined, the wavelength error being the difference between a wavelength for a particular pulse and a target wavelength; a pulse-by-pulse correction signal is determined based on the determined wavelength error, the pulse-by-pulse correction signal including a correction signal associated with each pulse in the first subset of pulses; and a correction based on the determined pulse-by-pulse correction signal is applied to each pulse in a second subset of pulses emitted from the optical source, where applying a correction to a pulse in the second subset of pulses reduces the wavelength error of the pulse in the second subset of pulses.

30 Claims, 10 Drawing Sheets

(56) References Cited

U.S. PATENT DOCUMENTS

2004/0021840 A1* 2/2004 Heintze .............. G03F 7/70041
355/30
2011/0116522 A1* 5/2011 Riggs ..................... G03F 7/705
372/32

FOREIGN PATENT DOCUMENTS

WO  200159894    8/2001
WO  2002069461   9/2002

OTHER PUBLICATIONS

International Search Report and Written Opinion, counterpart PCT Application No. PCT/US2016/023281, dated May 31, 2016, 15 pages total.
Office Action, counterpart Taiwanese Patent Application No. 105110381, dated Jan. 4, 2017, 6 pages total (including English translation of 3 pages).
Office Action, counterpart Japanese Patent Application No. 2017-50719, dated Nov. 30, 2018, 5 pages total (including English translation of 3 pages).
Office Action, counterpart Korean Patent Application No. 10-2019-7028558, 12 pages total (including English translation of 5 pages).
Office Action, counterpart Korean Patent Application No. 10-2017-7032257, dated May 2, 2019, 12 pages total (including English translation of 5 pages).
First Office Action, counterpart Chinese Patent Application No. 201680027079.4, dated Apr. 22, 2019, 22 pages total (including English translation of 12 pages).

* cited by examiner

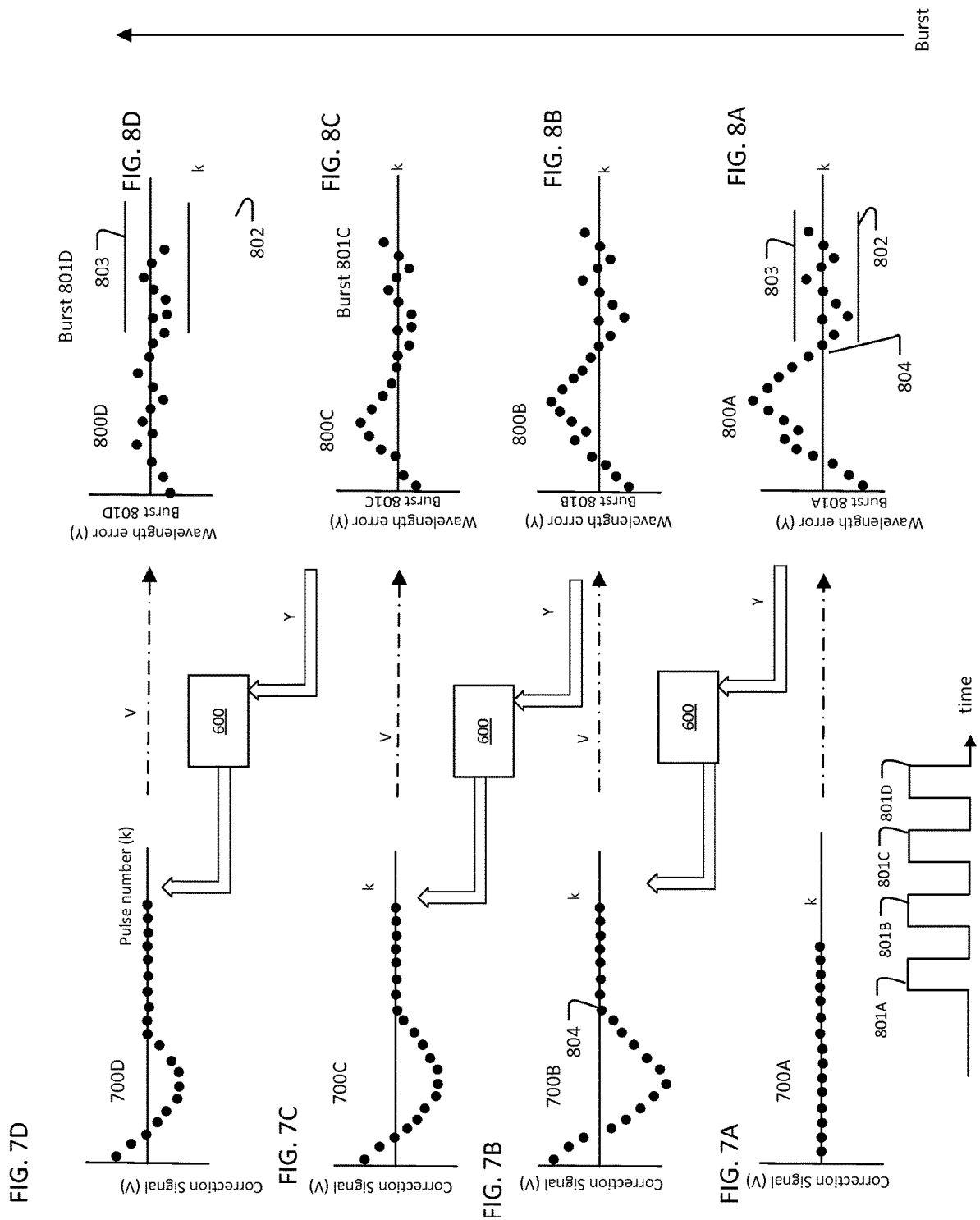

WAVELENGTH STABILIZATION FOR AN OPTICAL SOURCE

TECHNICAL FIELD

The disclosed subject matter relates to wavelength stabilization for an optical source.

BACKGROUND

Photolithography is the process by which semiconductor circuitry is patterned on a substrate such as a silicon wafer. A photolithography light source provides the deep ultraviolet (DUV) light used to expose a photoresist on the wafer. DUV light for photolithography is generated by excimer light sources. Often, the light source is a laser source and the pulsed light beam is a pulsed laser beam. The light beam is passed through a beam delivery unit, a reticle, and mask, and then projected onto a prepared silicon wafer. In this way, a chip design is patterned onto a photoresist that is then etched and cleaned, and then the process repeats.

SUMMARY

In one general aspect, a pulsed light beam emitted from an optical source is received, the pulsed light beam including at least a first burst of pulses of light and a second burst of pulses of light, the first burst of pulses including a first subset of pulses and the second burst of pulses including a second subset of pulses; a wavelength error for each pulse in the first subset of pulses is determined, the wavelength error being the difference between a wavelength for a particular pulse and a target wavelength; a pulse-by-pulse correction signal is determined based on the determined wavelength error, the pulse-by-pulse correction signal including a correction signal associated with each pulse in the first subset of pulses; and a correction based on the determined pulse-by-pulse correction signal is applied to each pulse in the second subset of pulses. Applying a correction to a pulse in the second subset of pulses reduces the wavelength error of the pulse in the second subset of pulses.

Implementations can include one or more of the following features. Determining a pulse-by-pulse correction signal based on the determined wavelength error can include determining a voltage signal for each pulse in the first burst of pulses, and applying a correction to each pulse in the second subset of pulses can include applying the voltage signal to an actuator coupled to an optical element that interacts with the pulses in the second subset of the pulses. The optical element can move in response to applying the voltage signal to the actuator, thereby changing the wavelength of a pulse that interacts with the optical element.

The first subset of pulses can include fewer than all of the pulses of light of the first burst of pulses of light, and the second subset of pulses can include fewer than all of the pulses of light of the second burst of pulses of light. The first subset of pulses can include the initial N pulses in the first burst of pulses, and the second subset of pulses can include the initial N pulses in the second burst of pulses.

The determined pulse-by-pulse correction signal can be filtered. Filtering the determined pulse-by-pulse correction signal can include applying a low-pass filter to the determined pulse-by-pulse correction signal, and the low-pass filter can include a filter that reduces portions of the pulse-by-pulse correction signal that are associated with a frequency greater than a frequency threshold. Filtering the determined pulse-by-pulse correction signal can include applying a low-pass filter to a determined wavelength error signal, with the determined wavelength error signal including the wavelength error for each pulse in the first burst of pulses. The first burst of pulses of light and the second burst of pulses of light can be separated by a temporal period, and the pulse-by-pulse correction signal can be determined during the temporal period. A filtered pulse-by-pulse correction signal can be determined during the temporal period. The second burst of pulses of light can occur after the first burst of light, and, in some implementations, the pulse-by-pulse correction signal is determined only after the first burst of light occurs.

One or more bursts can occur between the first burst and the second burst such that the first burst and the second burst are non-consecutive in time. The first burst of pulses of light can be the burst that immediately precedes the second burst of pulses of light in time.

The pulsed light beam can include a third burst of pulses of light, the third burst of pulses including a third subset of pulses, and the wavelength error for each pulse in the second subset of pulses can be determined after applying the correction, the wavelength error for each pulse can be compared to an upper threshold and a lower threshold, and, if the wavelength error of a threshold number of pulses is greater than the upper threshold or less than the lower threshold, a pulse-by-pulse correction signal for the second subset of pulses can be determined based on the determining the wavelength error for each pulse in the second subset of pulses, and a correction based on the pulse-by-pulse correction signal for the second subset of pulses can be applied to each pulse in the third subset of pulses.

In some implementations, a wavelength error of a plurality of pulses in the second burst of pulses of light can be determined, a model representing a secondary disturbance in the optical source can be accessed, a model representing dynamics of the actuator can be accessed, and a second correction signal can be determined based on the determined wavelength error of the plurality of pulses in the second burst of pulses of light and one or more of the model of the secondary disturbance and the model representing dynamics of the actuator. Applying a correction based on the determined pulse-by-pulse correction signal to each pulse in the second subset of pulses can further include applying the second correction signal to at least some of the pulses in the second subset of pulses. The correction can be based on the determined pulse-by-pulse correction signal and the second correction signal being added prior to application to the pulses in the second subset of pulses.

The wavelength for each pulse in the first subset of pulses can be determined.

In one general aspect, a pulsed light beam emitted from an optical source is received, the pulsed light beam including at least a first burst of pulses of light and a second burst of pulses of light, the first burst of pulses and the second burst of pulses being separated in time, and each of the first burst of pulses and the second burst of pulses including a transient wavelength error that varies with operating conditions; a wavelength error for two or more pulses in the first burst of pulses is determined, the wavelength error for a particular pulse being the difference between the wavelength of the particular pulse and a target wavelength; the transient wavelength error in the first burst of pulses of light is determined based on the determined wavelength error, a correction signal is determined based on the determined transient wavelength error, and a correction based on the correction signal is applied to at least some of the pulses of the second burst of pulses of light. Applying the correction reduces the transient wavelength error in the second burst of pulses compared to the transient wavelength error in the first burst of pulses.

Implementations can include one or more of the following features. The transient wavelength error that varies with operating conditions can be substantially invariant among bursts of pulses produced under a given set of operating conditions. The transient wavelength error can arise from an acoustic event within a chamber of the optical source that emits the pulsed light beam. The transient wavelength error can be characterized by an impulse response of a second or third order system. The first subset of pulses can include fewer than all of the pulses in the first burst of pulses of light, and the second subset of pulses includes fewer than all of the pulses in the second burst of pulses of light.

In one general aspect, a light system includes an optical source configured to emit a beam of light, the beam of light including bursts separated by temporal periods, each burst including pulses of light that occur at a temporal repetition rate; a line center analysis module configured to measure a wavelength of the pulses of light in the bursts of light; and a controller configured to receive the measurement of the wavelength at the temporal repetition rate. The controller includes a feedback module configured to determine a feedback correction signal to compensate for wavelength error of a particular pulse in a first burst of pulses, the feedback correction signal being based on a wavelength error of an earlier-occurring pulse in the first burst; a feed-forward stabilization module configured to determine a feed-forward correction signal to compensate for wavelength error of the particular pulse in the first burst of pulses based on a corresponding pulse in an earlier-occurring burst; one or more electronic processors coupled to a non-transitory computer readable medium including instructions that, when executed, cause the one or more electronic processors to: combine the feed-forward correction signal for the particular burst and the feedback signal for the particular burst to form a combined correction signal for the particular burst, and provide the combined correction signal to the optical source to reduce the wavelength error of the particular pulse in the first burst.

Implementations of any of the techniques described above may include a method, a process, a device, executable instructions stored on a computer-readable medium, a controller that includes an electronic processor and a computer-readable medium, the controller being configured to control a light source that produces bursts of pulses of light, or an apparatus. The details of one or more implementations are set forth in the accompanying drawings and the description below. Other features will be apparent from the description and drawings, and from the claims.

DRAWING DESCRIPTION

FIGS. 7A-7D are exemplary pulse-by-pulse correction signals.

FIGS. 8A-8D are exemplary pulse-by-pulse wavelength errors.

DETAILED DESCRIPTION

Techniques for compensating for a physical effect or a disturbance in or on a light source that causes a change to the wavelength of the light produced by the light source are disclosed.

The light source produces a pulsed light beam that includes bursts separated by periods where no light is produced, and each burst of light includes a plurality of pulses of light. The techniques discussed below provide compensation for the effects of disturbances that can be repeatable or invariant among at least some of the bursts in the pulsed light beam. Acoustic transients that can arise during operation of the light source, for example, as a result of the light source producing a burst of pulses, are an example of a repeatable disturbance. Such acoustic transients can manifest as density disturbances and/or variations in a gain medium of the light source, thus affecting the wavelength of the light produced by the light source. The nature of the wavelength variation can vary from source-to-source and can also vary during operation of a particular source.

The techniques discussed below can compensate for the effects of the repeatable disturbance by measuring the wavelength of the light produced by the source, determining a correction (for example, a correction signal) based on the measured wavelength, and applying the correction to a subsequent burst of pulses of light (a burst of pulses that occurs later in time) produced by the source. In this way, the technique is feed-forward and iteratively and progressively learns the characteristics of a disturbance that exists in a particular light source, providing the ability to compensate for variations in the wavelength without requiring prior knowledge of the geometry of the light source or the operating conditions. Further, by being feed-forward in nature, the compensation for variations in wavelength caused by such repeatable disturbances is independent of delays that can occur in equipment that measures wavelength. Additionally, the compensation can be achieved through software-based electronic control of the light source and without requiring physical changes to the discharge chamber of the light source.

In some implementations, the feed-forward technique can be used with other techniques that control the wavelength of the light produced by the light source in a feedback manner.

Figure 1:
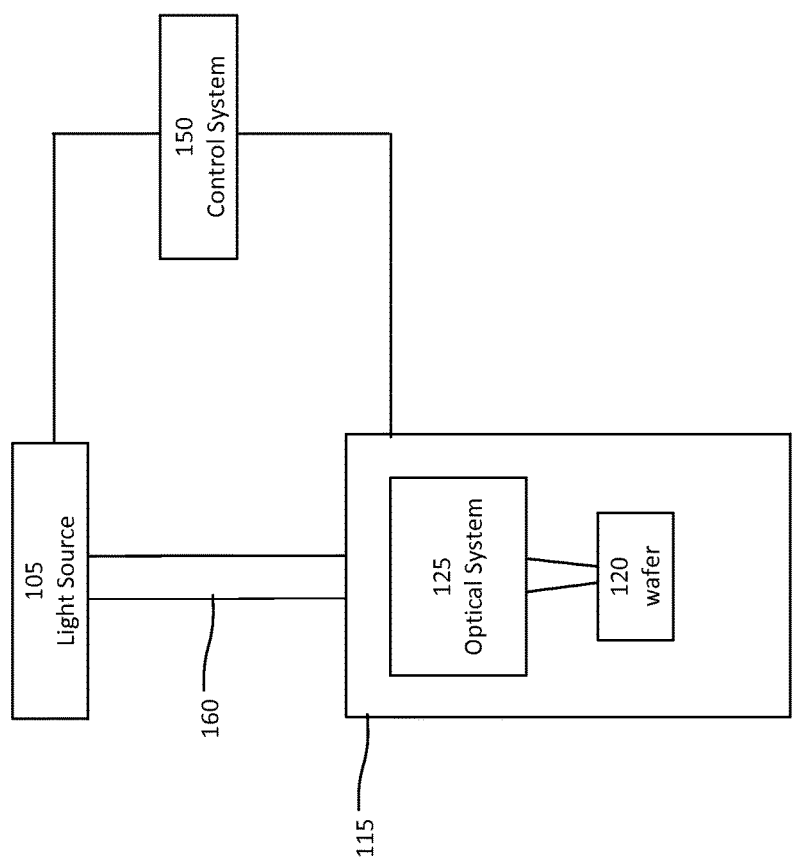
FIG. 1 is a block diagram of an exemplary photolithography system.

Referring to FIG. 1, a photolithography system 100 includes an optical (or light) source 105 that provides a light beam 160 to a wafer 120. The photolithography system 100 also includes a lithography exposure apparatus 115 that receives the wafer 120. The lithography exposure apparatus 115 includes a projection optical system 125. Microelectronic features are formed on the wafer 120 by, for example, depositing a layer of radiation-sensitive photoresist material on the wafer 120, and exposing the masked photoresist layer with the light beam 160. The lithography exposure apparatus 115 can be a liquid immersion system or a dry system. The system 100 also includes a control system 150 that controls the emission of light from the light source 105.

The light beam 160 can include a plurality or a band of wavelengths that are distributed about a center wavelength. The desired value of the center wavelength is referred to as the target wavelength. The critical dimension (CD), which is the smallest feature size that can be printed on the wafer 120 by the system 100, depends on the wavelength of the light beam 160. As discussed below, to maintain a uniform CD for microelectronic features printed on the wafer 120, and on other wafers exposed by the system 100, the center wavelength of the light beam 160 should remain at the target wavelength or within a range of wavelengths around the target wavelength. The difference between the target wavelength and the actual or measured wavelength of the light beam 160 is the wavelength error. Minimizing (or reducing) the wavelength error to remain in a range of values, or an error bound, may improve the performance of the system 100 by, for example, maintaining a more uniform wavelength of the light beam 160. When the wavelength error of the light beam 160 is within the range of values, the wavelength of the light beam 160 can be considered stabilized.

As discussed in greater detail below, the control system 150 uses a feed-forward technique to reduce the variation in the wavelength of the light beam 160, thereby improving the wavelength stability of the light beam 160. The control system 150 provides an electronic or a software-based compensation for a physical effect in the light source 105 that produces a repeatable disturbance that causes changes in the wavelength of the light beam 160. Acoustic waves that can arise in a discharge chamber of the optical source 105 are an example of such a physical effect that can affect and change the wavelength of the light beam 160. Additionally, the control system 150 can compensate for a physical effect that is unique to the light source 105 without prior knowledge of the details of the physical effect or the impact that the physical effect has on the wavelength of the light beam 160. In some implementations, the control system 150 also includes a complementary feedback technique.

Figure 2:
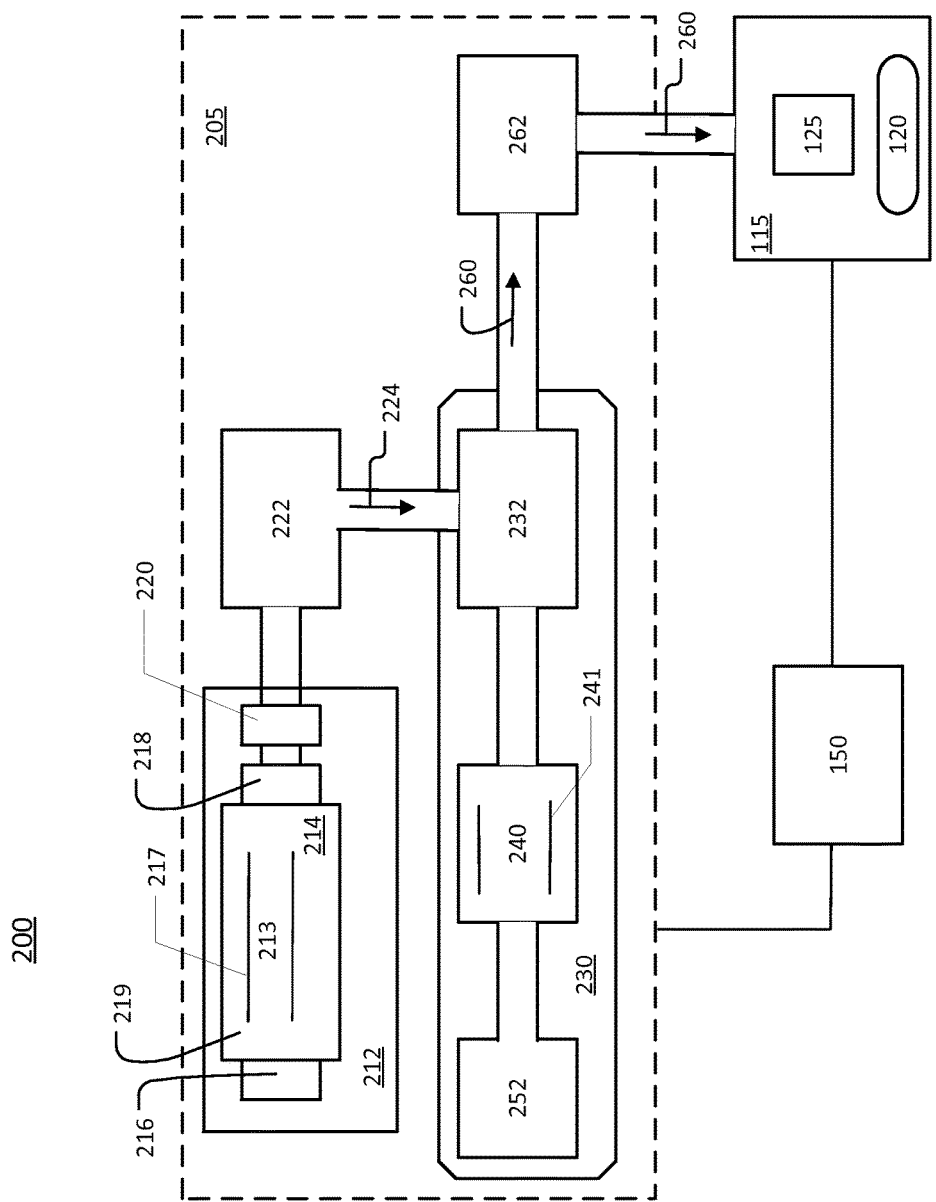
FIG. 2 is a block diagram of another exemplary photolithography system.

Referring also to FIG. 2, a block diagram of an exemplary photolithography system 200 is shown. In the system 200, an exemplary light source 205 is used as the light source 105 (FIG. 1). The light source 205 produces a pulsed light beam 260, which is provided to the lithography apparatus 115. The light source 205 can be, for example, an excimer light source that outputs the pulsed light beam 260 (which can be a laser beam). As the pulsed light beam 260 enters the lithography apparatus 115, it is directed through the projection optical system 125 and projected onto the wafer 120. In this way, one or more microelectronic features are patterned onto a photoresist on the wafer 120 that is then etched and cleaned, and the process repeats.

The system 200 also includes the control system 150, which, in the example of FIG. 2, is connected to components of the light source 205 as well as to the lithography exposure apparatus 115 to control various operations of the system 200. The control system 150 interacts with the light source 205 so that the wavelength error of the beam 260 is maintained within an error bound.

In the example shown in FIG. 2, the light source 205 is a two-stage laser system that includes a master oscillator (MO) 212 that provides a seed light beam 224 to a power amplifier (PA) 230. The master oscillator 212 enables fine tuning of parameters such as the center wavelength and the bandwidth at relatively low output pulse energies, for example, pulse energies of 1 to 1.5 millijoules (mJ) that are amplified by the power amplifier 230 to about 10 to 15 mJ. The power amplifier 230 receives the seed light beam 224 from the master oscillator 212 and amplifies the seed light beam 224 to generate the light beam 260 for use in the lithography apparatus 115.

The master oscillator 212 includes a discharge chamber 214 having two elongated electrodes 217, a gain medium 219 that is a gas mixture, and a fan for circulating gas between the electrodes 217. A resonator is formed between a line narrowing module 216 on one side of the discharge chamber 214 and an output coupler 218 on a second side of the discharge chamber 214. The line narrowing module 216 can include a diffractive optic such as a grating that finely tunes the spectral output of the discharge chamber 214. The master oscillator 212 also includes a line center analysis module 220 that receives an output light beam from the output coupler 218 and a beam modification optical system 222 that modifies the size or shape of the output light beam as needed to form the seed light beam 224. The line center analysis module 220 is a measurement system that can be used to measure or monitor the wavelength of the seed light beam 224. The line center analysis module 220 can be placed at other locations in the light source 205, or it can be placed at the output of the light source 205.

The gas mixture used in the discharge chamber 214 can be any gas suitable for producing a light beam at the wavelength and bandwidth required for the application. For example, for an excimer source, the gas mixture can contains a noble gas (rare gas) such as, for example, argon, krypton, or xenon and a halogen, such as, for example, fluorine or chlorine, apart from helium and/or neon as buffer gas. Specific examples of the gas mixture include argon fluoride (ArF), which emits light at a wavelength of about 193 nm, krypton fluoride (KrF), which emits light at a wavelength of about 248 nm, or xenon chloride (XeCl), which emits light at a wavelength of about 351 nm. The excimer gain medium (the gas mixture) is pumped with short (for example, nanosecond) current pulses in a high-voltage electric discharge by application of a voltage to the elongated electrodes 217.

The power amplifier 230 includes a beam modification optical system 232 that receives the seed light beam 224 from the master oscillator 212 and directs the light beam through a discharge chamber 240, and to a beam turning optical element 252, which modifies or changes the direction of the seed light beam 224 so that it is sent back into the discharge chamber 240. The discharge chamber 240 includes a pair of elongated electrodes 241, a gain medium 219 that is a gas mixture, and a fan for circulating the gas mixture between the electrodes 241.

The output light beam 260 is directed through a bandwidth analysis module 262, where various parameters (such as the bandwidth or the wavelength) of the beam 260 can be measured. The output light beam 260 can also be directed through a pulse stretcher, where each of the pulses of the output light beam 260 is stretched in time, for example, in an optical delay unit, to adjust for performance properties of the light beam that impinges the lithography apparatus 115.

The control system 150 is connected to various components of the light source 205. For example, the control system 150 is coupled to the electrodes 217, 241 within the master oscillator 212 and the power amplifier 230, respectively, for controlling the respective pulse energies of the master oscillator 212 and the power amplifier 230, and also for controlling the pulse repetition rates, which can range between about 500 and 12,000 Hz or greater. The control system 150 therefore provides repetitive triggering of the discharges in the chamber of the master oscillator 212 and the discharges in the chamber of the power amplifier 230 relative to each other with feedback and/or feed-forward control of the pulse and dose energy. The repetitively-pulsed light beam 260 can have an average output power of between a few watts and hundreds of watts, for example, from about 40 W to about 200 W. The irradiance (that is, the average power per unit area) of the light beam 260 at the output can be at least about 60 W/cm$^2$ or at least about 80 W/cm$^2$.

The output power of the light source 205 can be calculated at 100% duty cycle (that is, the continuous firing of the electrodes in the master oscillator 212 and the power amplifier 230 of the light source 205) at a nominal pulse repetition rate and a nominal pulse energy. Thus, for example, at a nominal pulse repetition rate of 6000 Hz and a 15 mJ nominal pulse energy, the output power of the light source 205 (which is the power of the light beam 260) is 90 W. As another example, at a nominal pulse repetition rate of 6000 Hz and a 20 mJ nominal pulse energy, the output power of the light source 205 (which is the power of the light beam 260) is 120 W.

Additionally, the control system 150 controls when the light source 205 emits a pulse of light or a burst that includes one or more pulses of light by sending one or more signals to the light source 205. The light beam 260 can include one or more bursts that are separated from each other in time. Each burst can include one or more pulses of light. In some implementations, a burst includes hundreds of pulses, for example, 100-400 pulses.

Figure 3:
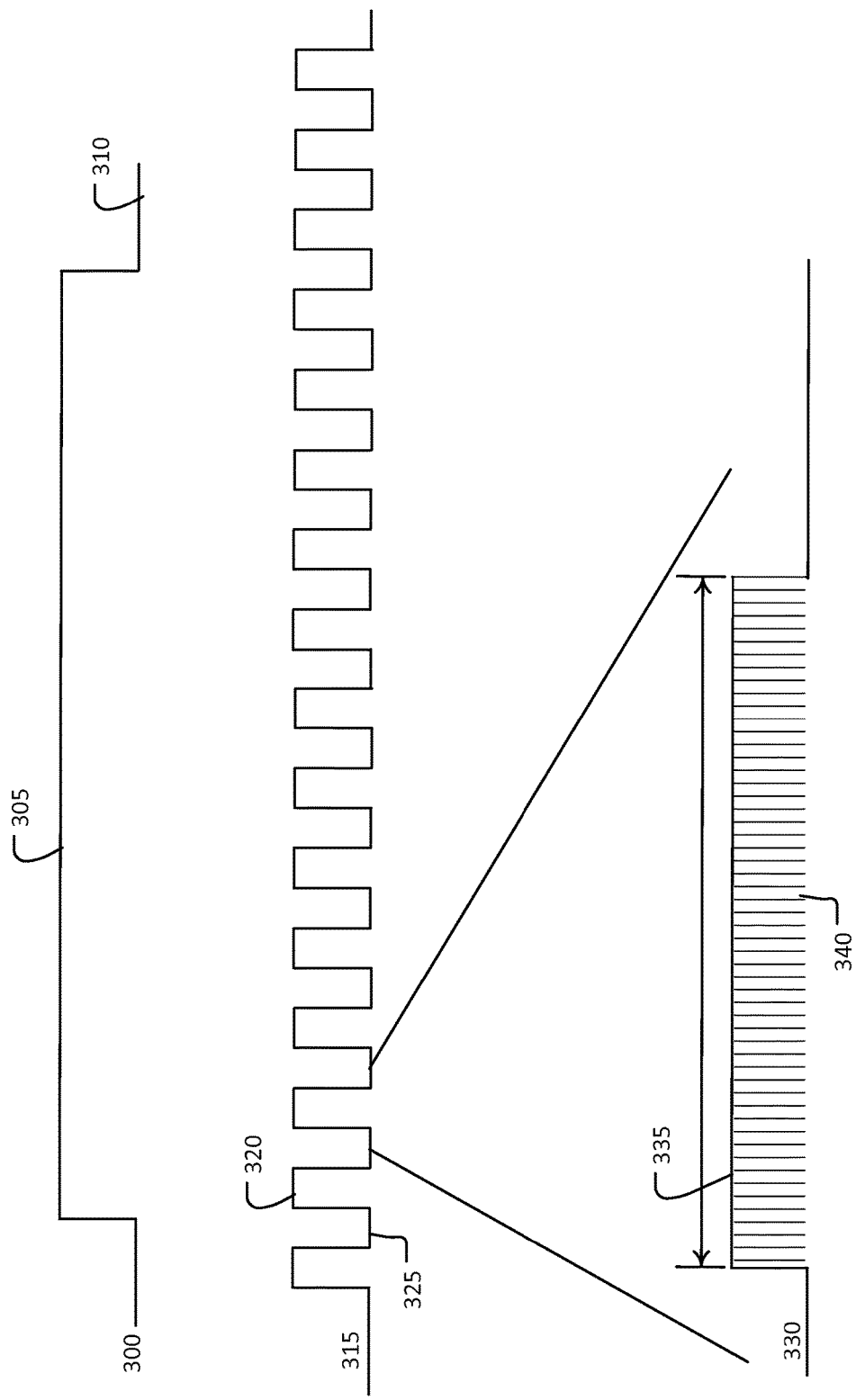
FIG. 3 are traces of exemplary signals that are used to control an optical source that is part of a photolithography system.

Referring also to FIG. 3, the control system 150 can be configured to send a wafer exposure signal 300 to the light source 205 to control the light source 205 to expose the wafer 120 to the light beam 260. The wafer exposure signal 300 can have a high value 305 (for example, 1) while the wafer 120 is being exposed and a low value 310 (for example, 0) when the wafer 120 is not being exposed. Additionally, the control system 150 sends a gate signal 315 to the light source 205. The gate signal 315 has a high value 320 (for example, 1) during a burst of pulses and a low value 325 (for example, 0) during the time between successive bursts. The control system 150 also sends a trigger signal 330 to the light source 205. The trigger signal 330 has a high value 335 (for example, 1) during each pulse of the light source 205 and a low value 340 (for example, 0) for the time between each successive pulse.

As discussed above, when the gain medium 219 is pumped by applying voltage to the electrodes 217, the gain medium 219 emits light. When voltage is applied to the electrodes 217 in pulses, the light emitted from the medium 219 is also pulsed. Thus, the repetition rate of the pulsed light beam 260 is determined by the rate at which voltage is applied to the electrodes 217, with each application of voltage producing a pulse of light. The trigger signal 330, for example, can be used to control the application of voltage to the electrodes 217 and the rate of the pulses. The pulse of light propagates through the gain medium 219 and exits the chamber 214 through the output coupler 218. Thus, a train of pulses is created by periodic, repeated application of voltage to the electrodes 217.

The electric discharge created by applying the voltage to the electrodes 217 also can create acoustic waves in the chamber 214. These acoustic waves can propagate in the chamber 214 and can be reflected from the walls of the chamber 214. The acoustic waves and/or the reflections of the acoustic waves can create pressure fronts in the gain medium. The reflections of the acoustic waves generated by an earlier discharge of the electrodes 217 can be present in a discharge region 213, which is between the electrodes 217, at a time at which the electrodes 217 are discharging to produce a subsequent pulse of light. In this manner, the reflected acoustic waves can deflect the subsequent pulse of light.

Because the wavelength of the pulse of light depends on the angle at which the light interacts with a diffractive optic (such as the line narrowing module 216), deflecting the subsequent pulse of light such that the angle at which the light propagates in the chamber 214 is modified changes the wavelength of the pulse of light. Thus, the acoustic waves and the reflections of the acoustic waves from chamber walls can cause an increase in the wavelength error of the pulsed light beam 260. The deflection caused by the acoustic waves in the chamber 214 depends on the geometry of the chamber 214, manufacturing tolerances of the chamber 214, the temperature of the chamber 214, and other factors that can vary between different light sources and/or can vary with the operating conditions of the light source. For the first few pulses of the burst the pressure fronts are well pronounced, resulting in a beginning of the burst acoustic transient that increases wavelength error. This beginning of the burst acoustic transient and its impact on the wavelength of the pulsed light beam 260 has a repeatable profile for the first few pulses from one burst to the next burst for the same operating conditions. After a few pulses, these pressure fronts get scrambled and contribute to noise in wavelength error instead of having a clear repeatable profile for their impact on wavelength error. The exact impact of this acoustic transient on the wavelength of the pulsed light beam 260 can typically only be accurately determined experimentally, is not likely to be known beforehand, and can vary during operation of the light source 205.

The control system 150 compensates for such a repeatable wavelength error that arises during operation of the light source 205 without requiring that information about the wavelength error in the current burst or its cause be known beforehand as long as the wavelength error is burst invariant (in other words, the wavelength error is the same or similar for the pulses in at least two of the bursts in the pulsed light beam 260). Additionally, the control system 150 compensates for wavelength error of pulses in a burst on a pulse-by-pulse basis using information determined from wavelength data of pulses in an earlier-occurring burst of pulses.

Figure 4A:
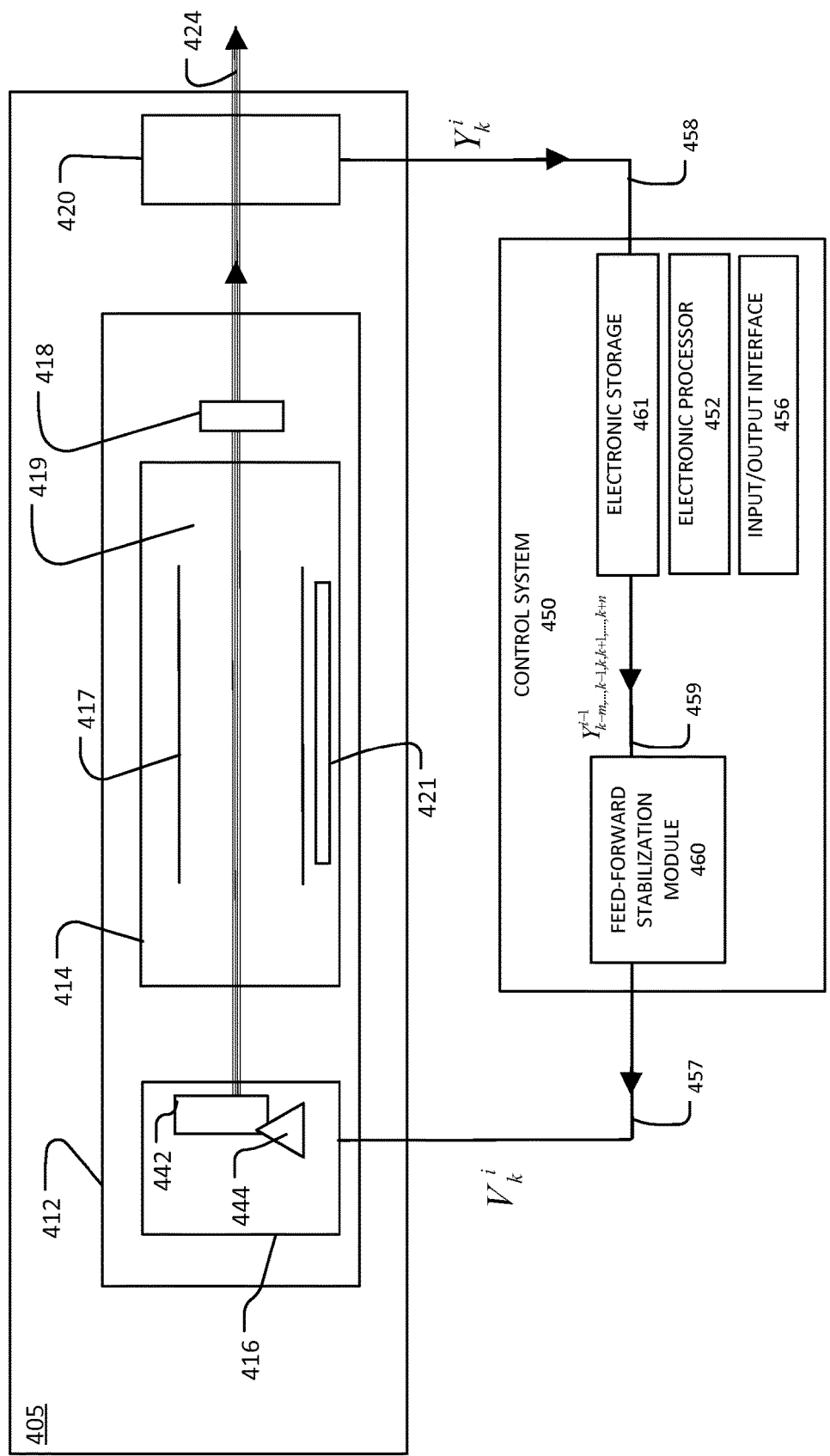
FIG. 4A is a block diagram of an exemplary optical system that includes a light source and a feed-forward control system.

Referring to FIG. 4A, a block diagram of an exemplary optical system 400 is shown. The optical system 400 includes a light source 405, which emits a light beam 424, and a control system 450. The control system 450 can be used as the control system 150 in the systems 100 (FIG. 1) and 200 (FIG. 2). The light source 405 can be similar to the light sources 105 (FIG. 1) or 205 (FIG. 2).

The light beam 424 includes bursts and pulses of light within each burst. The pulses of light are produced at the repetition rate of the light source 405, and the bursts are separated by temporal periods in which no pulses of light are emitted from the light source.

The control system 450 receives information about the wavelength of the pulses in a burst of pulses from a line center analysis module 420 via a signal 458, and reduces the wavelength error of the light beam 424 to within an acceptable range by providing a correction signal 457, which is also referred to as a pulse-by-pulse correction signal or a feed-forward correction signal, to the light source 405. The control system 450 includes a feed-forward stabilization module 460 that determines the correction signal 457.

The feed-forward correction signal 457 is determined from the wavelength data of the pulses in an earlier burst, and, consequently, determination of the feed-forward correction signal 457 is not dependent on receiving wavelength information regarding the pulses of the burst that is currently propagating in the light source 405 and is not impacted by delays in receiving data from the line center analysis module 420. Thus, the feed-forward correction signal 457 can be applied to a light source that produces pulses at a high repetition rate, for example, a repetition rate of 6,000 Hertz (Hz) or greater. The components of the light source 405 are discussed before discussing the feed-forward stabilization module 460 in greater detail.

The light source 405 includes a discharge chamber 414 having two elongated electrodes 417, a gain medium 419 that is a gas mixture, and a fan 421 for circulating gas between the electrodes 417. A resonator is formed between a line narrowing module 416 on one side of the discharge chamber 414 and an output coupler 418 on a second side of the discharge chamber 414. When a voltage is applied to the electrodes 417, the gain medium 419 emits light that propagates in the resonator to form the pulsed light beam 424. The line narrowing module 416 includes the optical element 442 that interacts with the light that propagates in the resonator by, for example, reflecting and/or refracting the light. The optical element 442 can be a diffractive optic such as a grating that finely tunes the spectral output of the light beam 424. In some implementations, the optical element 442 is a refractive element that disperses light based on the wavelength of the light, such as a prism. In some implementations, the optical element 442 can be an optical apparatus that includes more than one optical element, and can, for example, have both refractive and reflective components.

The optical element 442 is coupled to an actuator 444 that is controllable to move or modify the shape of the optical element 442. The actuator 444 can be any type of actuator that is capable of causing the optical element 442 to move or to change shape. For example, the actuator 444 can be a piezoelectric material that changes shape and/or size in response to application of a voltage. In this example, applying a voltage to change the shape of the actuator 444 causes the optical element 442 to move. The optical element 442 can be coupled to the actuator 444 through direct or indirect physical contact. For example, the actuator 444 can touch the optical element 442 or an element (such as a mount) that touches the optical element 442. In some implementations, the actuator 444 causes the optical element 442 to move without making physical contact.

The light source 405 also includes a line center analysis module 420 that receives an output light beam from the output coupler 418 to form the pulsed light beam 424. The line center analysis module 420 is a measurement system that monitors and/or measures the wavelength of the pulses of the pulsed light beam 424. In some implementations, the line center analysis module 420 measures the wavelength of each pulse in the pulsed light beam 424.

The wavelength information measured by the line center analysis module 420 is provided to the control system 450 via the signal 458. The wavelength information can include, for example, data that indicates the wavelength, measured center wavelength, wavelength band, and/or the wavelength error of a pulse of light in the beam 424. The control system 450 can receive wavelength information from the line center analysis module 420 for each pulse (indicated in subscript, indexed by k) in a burst (indicated in superscript, indexed by i). The control system 450 receives an instance of the signal 458, ($Y_k^i$), which represents the wavelength information of pulse k in burst i from the line center analysis module 420 at the temporal repetition rate of the light beam 424. Thus, the control system 450 can receive an instance of the signal 458 ($Y_k^i$) for every pulse in a burst. These received instances of the signal 458 are stored in the electronic storage 461 and used to determine a feed-forward correction signal to be applied to the pulses of a subsequent (later occurring) burst.

Figure 4B:
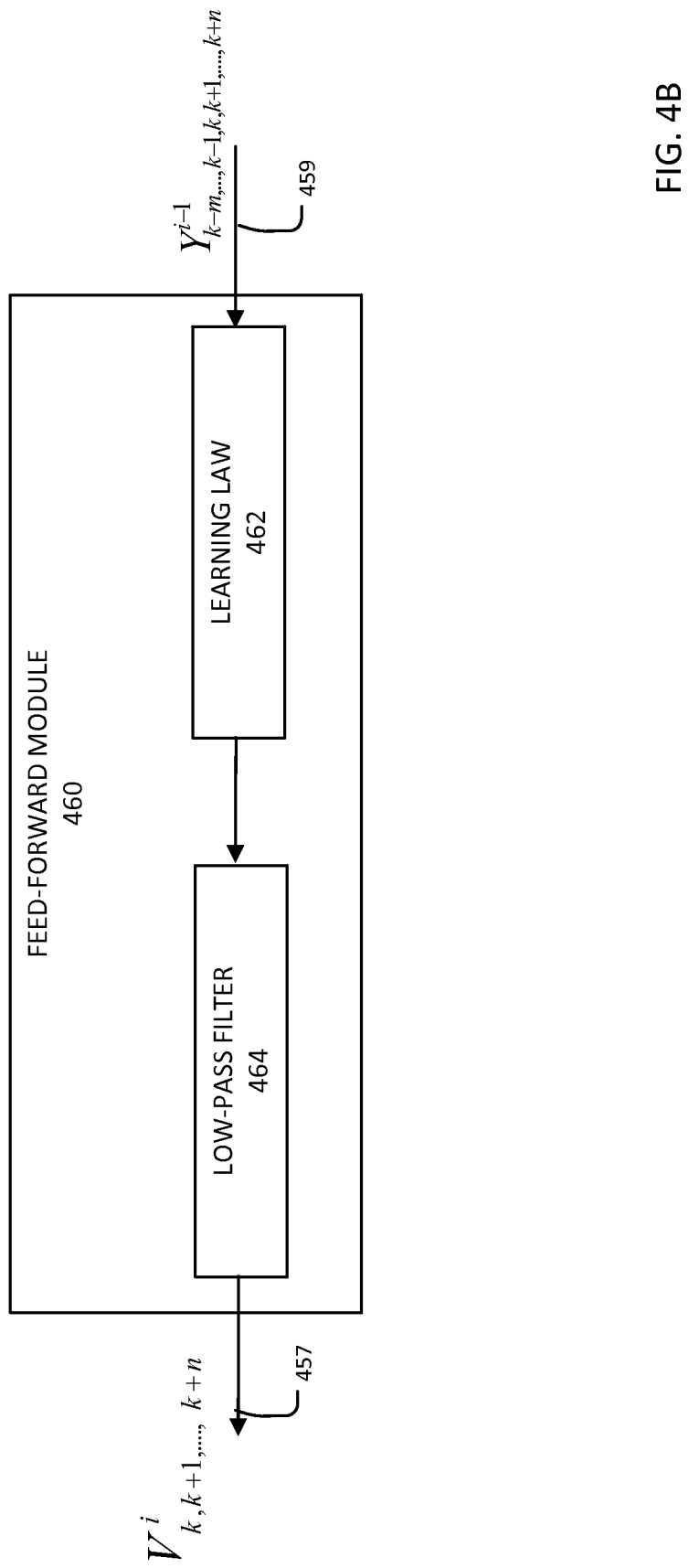
FIG. 4B is a block diagram of an exemplary feed-forward stabilization module.

Referring also to FIG. 4B, the feed-forward stabilization module 460 uses wavelength information from the pulses of an earlier burst to determine the feed-forward correction signal 457. As discussed above, the received instances of the signal ($Y_k^i$) 458 are stored in the electronic storage 461 (FIG. 4A). To determine the feed-forward correction signal 457 to apply to the pulses of the burst i, a prior instance 459 of the wavelength information is accessed or retrieved from the electronic storage 461. The prior instance 459 includes the wavelength information for each pulse in a subset of pulses k−m to k+n of the burst i−1 and is represented as ($Y_{k-m}, \ldots, k-1, k, k+1, \ldots, k+n^{i-1}$), with n, m, k, and i being integer values. In this example, the prior instance 459 includes wavelength data for a series of temporally consecutive pulses (such as pulses k and k+1). However, in other examples, the prior instance 459 includes wavelength data for a subset of pulses, none of which are consecutive to any other pulse in the subset, or wavelength data for a subset of pulses that include pulses that are not consecutive to any other pulse in the subset and pulses that are consecutive to at least one other pulse in the subset. In other words, the subset of pulses in the burst i−1 used to determine the feed-forward signal 457 can include any or all of the pulses in the burst i−1.

Additionally, in this example, the prior instance 459 that is used to determine the feed-forward correction signal 457 that is applied to the pulses of the burst i is the wavelength information from the immediately preceding burst (burst i−1). However, in other examples, the prior instance 459 can include wavelength data from any prior burst and/or can include wavelength data from a plurality of prior bursts.

The feed-forward stabilization module 460 uses the prior instance 459 ($Y_{k-m}, \ldots, k-1, k, k+1, \ldots, k+n^{i-1}$) to determine the feed-forward correction signal 457 ($V_{k-m}, \ldots, k-1, k, k+1, \ldots, k+n^{i}$), which includes a signal, information, and/or value for each pulse in a subset of pulses k−m to k+n of the burst i. The instance of the feed-forward correction signal 457 ($V_k^i$) is a value, waveform, or quantity that, when applied to the line narrowing module 416 while the pulse k of the burst i is interacting with the optical element 422 would reduce or eliminate the wavelength error of pulse k that arises from a repeatable disturbance.

The feed-forward stabilization module 460 includes a learning law module 462 and, in some implementations, can include a low-pass filter module 464. The learning law module 462 can include, for example, an iterative learning control (ILC) technique, such as, for example, PD-type (proportional derivative-type) iterative learning control, quadratic iterative learning control (Q-ILC), plant inversion, and/or H-infinity. The learning law module 462 analyzes the wavelength data to determine (or learn) the characteristics of the wavelength error (such as the magnitude of the wavelength error) for each pulse in the subset of pulses. In this manner, the learning law module 462 and the feed-forward stabilization module 460 correct for wavelength error without requiring prior knowledge of the geometry of the light source 405 and are also able to adapt to changes in the impact of the disturbance that can occur slowly over time.

The low-pass filter module 464 filters the output of the learning law module 462 and/or the wavelength data to reject rapid changes in wavelength or wavelength error. The low-pass filter module 464 acts to block high-frequency components (for examples frequencies or components that are 1,000 Hz or greater) of the wavelength error that can be caused by disturbances that are not repeatable or rapidly varying from burst-to-burst. For example, the low-pass filter module 464 prevents one-time disturbances that affect the wavelength data of only one burst from significantly modifying the feed-forward correction signal 457. Inclusion of a one-time disturbance in the feed-forward correction signal 457 could result in moving an optical element in the line narrowing module 416 a relatively large amount that would cause the wavelength error of other pulses in the burst i and/or subsequent bursts to increase.

Additionally, use of the low-pass filter module 464 allows the feed-forward correction signal 457 to converge within a few (for example, 10 or fewer) bursts. The feed-forward correction signal 457 can be considered to have converged, for example, when the wavelength error for the pulses within a burst to which the feed-forward correction signal 457 has been applied is completely within an acceptable range of values. FIGS. 7A-7D and 8A-8D show an example of progressive compensation for wavelength error and convergence of a feed-forward correction signal that is applied to bursts of pulses produced by an optical source.

Along with the electronic storage 461, the control system 450 also includes an electronic processor 452 and an input/output (I/O) interface 456. The electronic storage 461 can be volatile memory, such as RAM, or non-volatile memory. In some implementations, the electronic storage 461 can include both non-volatile and volatile portions or components. The electronic storage 461 stores instructions, perhaps as a computer program, that, when executed, cause the processor 452 to communicate with other components in the control system 450 and/or the light source 405. For example, the instructions can be instructions to cause the electronic storage 461 to store data related to the wavelength of the pulses in the pulsed light beam 424. The instructions can be instructions that cause the electronic processor 452 to, for example, retrieve a pulse-by-pulse correction signal 457 and/or to analyze stored wavelength information to determine a pulse-by-pulse correction signal 457, and to generate a voltage signal based on the pulse-by-pulse correction signal 457.

The electronic processor 452 is one or more processors suitable for the execution of a computer program such as a general or special purpose microprocessor, and any one or more processors of any kind of digital computer. Generally, a processor receives instructions and data from a read-only memory or a random access memory or both. The electronic processor 452 can be any type of electronic processor.

The I/O interface 456 is any kind of electronic interface that allows the control system 450 to receive and/or provide data and signals with an operator, the light source 405, and/or an automated process running on another electronic device. For example, the I/O interface 456 can include one or more of a visual display, a keyboard, or a communications interface.

Figure 5A:
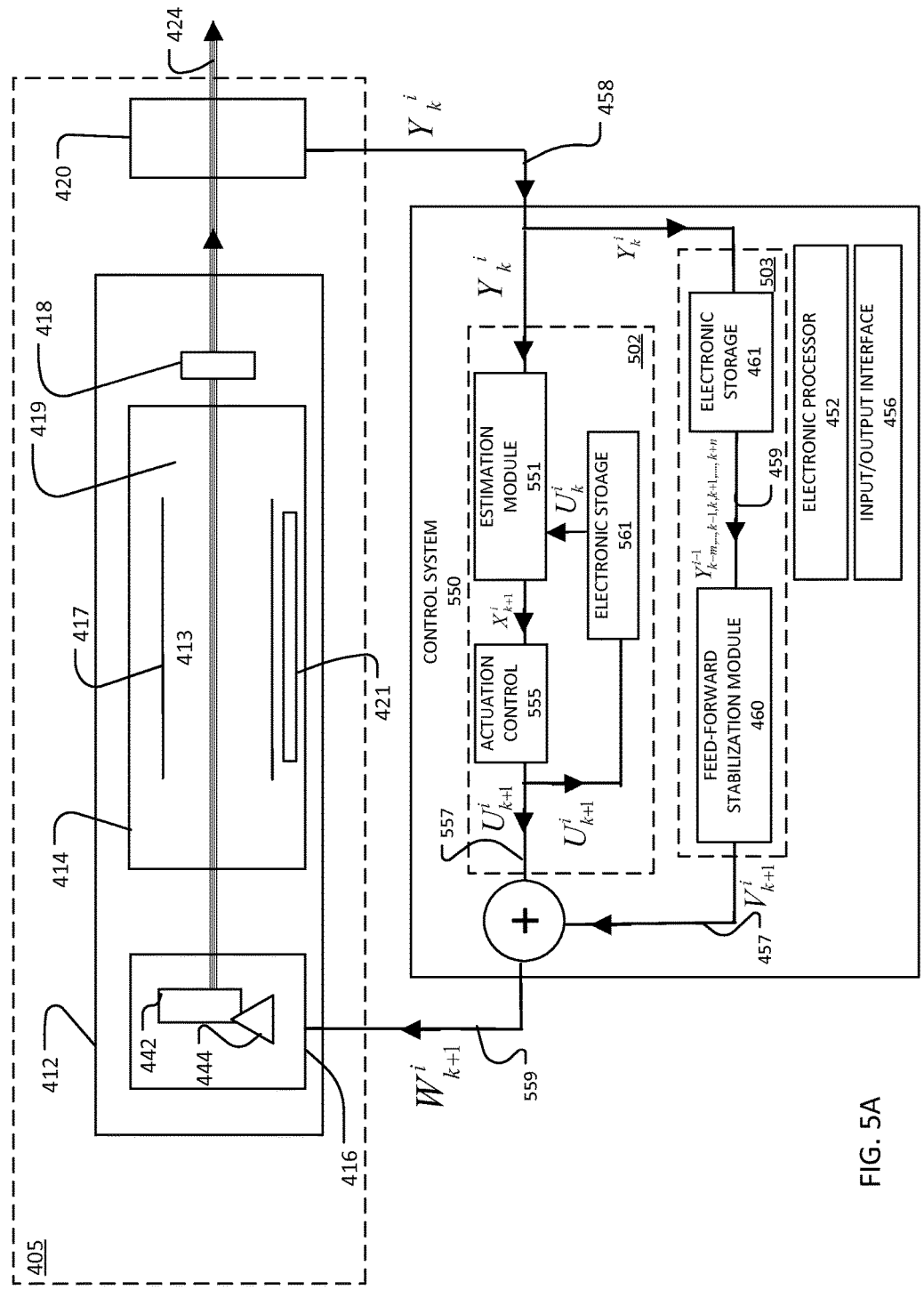
FIG. 5A is a block diagram of an exemplary optical system that includes a light source and a control system with feed-forward and feedback paths.

Referring to FIG. 5A, a block diagram of another exemplary optical system 500 is shown. The optical system 500 includes the light source 405 and a control system 550 that receives wavelength data from the light source 405 via the signal 458. The control system 550 includes a feedback path 502 and a feed-forward path 503 that complement each other and can achieve additional reduction in wavelength error.

The feed-forward path 503 includes the feed-forward stabilization module 460, which produces the feed-forward correction signal 457 ($V_{k, k+1, \ldots, k+n}^{i}$) to correct or reduce the wavelength error in pulses k to k+n of the burst i as discussed above with respect to FIGS. 4A and 4B. As discussed above, the feed-forward correction signal 457 ($V_{k-m, \ldots, k-1, k, k+1, \ldots, k+n}^{i-1}$) is determined based on wavelength data from the pulses k−m to k+n of the burst i.

The feedback path 502 produces a feedback correction signal 557 ($U_{k+1}^{i}$), which corrects the wavelength error of the pulse k+1 of the burst i based on the wavelength information ($Y_k^i$) for a previous pulse (pulse k) of the burst i. The feedback correction signal 557 (U) is added to the feed-forward correction signal 457 to produce a correction signal 559 (W) that is applied to the line narrowing module 416. The feedback path 502 also includes an electronic storage 561. The electronic storage 561 can be the same type of component as the electronic storage 461. Additionally, the electronic storage 561 and the electronic storage 461 can be implemented as a single electronic storage.

The feedback path 502 is complementary to the feed-forward path 503. As discussed above, the feed-forward correction signal 457 (V) corrects for disturbances that are slowly varying or invariant burst-to-burst. In addition to a disturbance that is slowly varying burst-to-burst, various other disturbances and physical effects can contribute to wavelength error. For example, the wavelength error can be caused by the position of an optical element 442 that interacts with light in the optical source 405, drift, and/or mechanical vibrations. The feedback path 502 can be used to account for such disturbances in addition to those addressed by the feed-forward path 503.

The feedback path 502 can include any feedback controller or module. A feedback controller is used to modify a characteristic of a system. The feedback controller has an input, which is a measurement of the characteristic and is received from the system, and an output, which is a signal or data provided to the system to modify the characteristic of the system. When an input is received, the next output that will be provided to the system is changed or actuated based on the received input. In the feedback path 502, the wavelength data from the line center analysis module 420 provided by the signal 458 is the input, and the output is the feedback correction signal 557. For example, the instance of the signal 458 ($Y_k^i$), which includes wavelength information for the pulse k of burst i, is an input to the feedback path 502, and the feedback path 502 produces an instance of the feedback correction signal 557 ($U_{k+1}^i$), which is a signal to correct the wavelength of the next pulse (the pulse k+1) in the burst i based on that input. The feedback correction signal 557 is added to the feed-forward correction signal 457, which includes a value for each pulse in the burst i, to produce the correction signal 559. The instance of the correction signal 559 that is provided to the line narrowing module 416 to correct pulse k+1 in the burst i is represented as shown in Equation 1:

$$W_{k+1}^{i} = U_{k+1}^{i} + V_{k+1}^{i} \tag{1},$$

where $U_{k+1}^{i}$ is the feedback correction signal 557 determined by the feedback path 502 for pulse k+1 of burst i and $V_{k+1}^{i}$ is the feed-forward correction signal 457 determined by the feed-forward path 503 for pulse k+1 of burst i.

Any controller that acts in a feedback manner can be used as the feedback path 502. In the example of FIG. 5A, the feedback path 502 includes an estimation module 551 that accounts for disturbances through, for example, a model, and an actuation control 555. The estimation module 551 estimates disturbance states, represented as a time-varying array X, that affect wavelength as well as the states of components in the optical source 405 (such as the optical element 442) and provides the estimates to the actuation control 555. Based on the estimated states, the actuation control 555 determines the feedback correction signal, U (557), that, when applied to the optical source 405, causes the actuator 444 to move in a manner that compensates for various disturbances that the estimation module 551 predicts to be present in the optical source 405. The signal 557 can represent an amount of change relative to a signal that was previously determined or the signal 557 can be an absolute value that is not relative to another determined value.

Figure 5B:
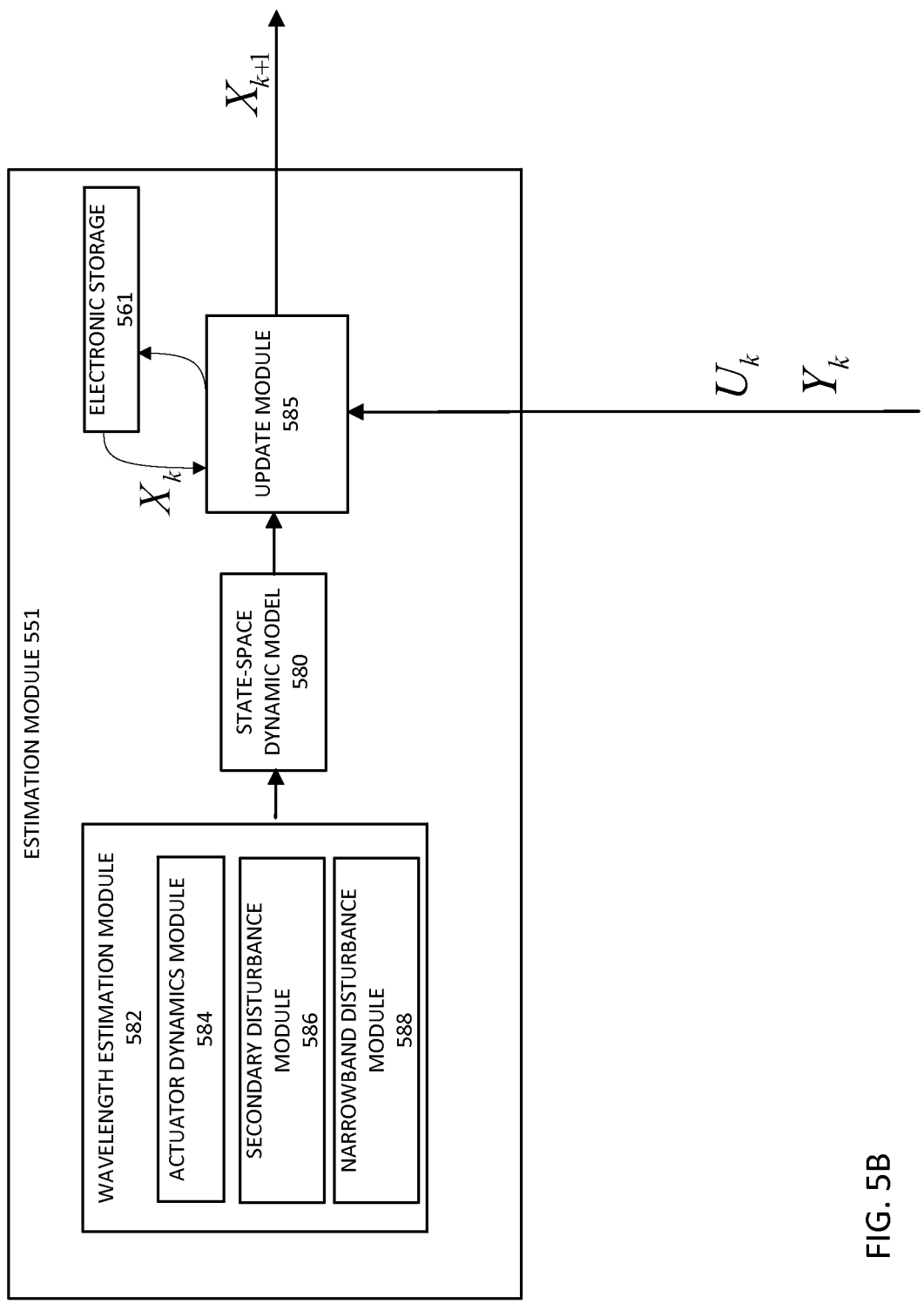
FIG. 5B is a block diagram of an exemplary estimation module that can be included in the feedback path of FIG. 5A.

Referring also to FIG. 5B, in some implementations, the estimation module 551 also includes a wavelength estimation module 582 that models disturbances and system variability. The wavelength estimation module 582 includes an actuator dynamics module 484, a secondary disturbance module 586, and a narrowband disturbance module 588. The actuator dynamics module 584 provides a model of the behavior of the optical element 442 and/or the actuator 444. This model can be used to make periodic predictions of the state of the optical element 442 and/or the actuator 444. The state of the optical element 442 can include, for example, one or more values that represent the position and/or velocity of the optical element 442.

The actuator dynamics module 584 provides a model of the physical movement or action of the actuator 444 in response to application of an input to the actuator 444. For example, in instances in which the actuator 444 is a piezoelectric transducer (PZT), the actuator dynamics module 584 models the actuator 444 as a second-order system. The state of the actuator 444 can be any quantity or quality associated with the actuator 444 that can vary with time. For example, the state can be a voltage that is applied to the actuator 444. The state of the actuator 444 can include more than one quantity or quality. For example, the state of the actuator can be a current position, and a current velocity of the actuator in one or more dimensions and the voltage that was most recently applied to the actuator 444. The secondary disturbance module 586 models well understood disturbances in the optical source 405. For example, the secondary disturbance module 586 can model wavelength drift with time. The narrowband disturbance module 588 models disturbances that are present over a small band of frequencies (for example, a disturbance that is present within a band of 10 Hertz (Hz) or less).

In the estimation module 551, the output of the wavelength estimation module 582 forms a state-space dynamic model 580 that includes matrices A and B. The matrices A and B are provided to the update module 585, which predicts or estimates $X_{k+1}^i$, which is the state array X for the next pulse (k+1) based on the value of $X_k^i$ and the feedback signal $U_k^i$ for the current pulse k. Using Equation (2), an estimate of the state $X_{k+1}^i$ can be obtained from:

$$X_{k+1}^i = AX_k^i + BU_k^i \qquad (2)$$

where k indexes the pulses in the burst i (with k being the data associated with the current or most recent pulse and k+1 being the next or immediately subsequent pulse), U represents the feedback correction signal 557 determined by the actuation control 555, and the coefficients of the matrices A and B are provided by the wavelength estimation module 582. Thus, $X_k^i$ is a current state of one or more components or conditions in the optical source 405, and $U_k^i$ is the most recently generated output of the actuation control 555 (the feedback correction signal 557). The previous values of X (for example, $X_k^i$) are stored in and can be obtained from the electronic storage 561, and the values of $U_k^i$ can be obtained from the actuation control 555. Thus, $X_{k+1}^i$ can be determined from Equation (2).

The method as discussed above is based on a priori information, such as information known about the optical source 405 and included in the wavelength estimation module 582 and the state-space dynamic model 580. However, this a priori information, assumed to be accurate information about the optical source 405, may not be perfectly accurate due to variation between systems or other uncaptured information. Thus, the second function of the update module 585 is to use the previous wavelength measurement received from the line center analysis module 420 via the signal 458 to update the state estimate $X_k^i$ to be closer to reality, producing an updated measurement, $\tilde{X}_k^i$, which is based on measured data. This measurement update may be performed, for example, using a Kalman filter. Then an estimate of the state $X_{k+1}^i$ can be obtained from equations (3) as:

$$X_{k+1}^i = A\tilde{X}_k^i + BU_k^i \qquad (3)$$

After $X_{k+1}^i$ is determined, the estimation module 551 provides $X_{k+1}^i$ to the actuation control 555. The actuation control 555 determines the feedback correction signal 557, U, that if provided to the optical source 405 at the pulse (k+1), would act on the optical source 405 and/or a component of the optical source 405 to achieve the wavelength close to the desired wavelength of the light beam 424, while satisfying certain constraints. This desired wavelength can be, for example, the target wavelength. The determination of the signal 557 may include, for example, optimizing the value of U (the signal provided to the optical source 405) to minimize the wavelength error in view of the values included in X, accounting for constraints. An example of a constraint used in the optimization can be that the absolute value of U be less than a threshold value. For example, U can represent a voltage or current that is applied to the actuator 444 to move the optical element 442. A constraint that prohibits large values of U can prevent the application of large currents or voltages to the actuator. The optimization can be implemented as, for example, a linear quadratic regulator (LQR). The output of actuation control 455 may be an incremental change to U that is then added linearly to the present value of $U_k^i$.

Thus, the actuation control 555 determines the next value of the feedback correction signal 557 or the incremental change as compared to the present value of the feedback correction signal 557 (either of which is represented in this example by $U_{k+1}^i$) and provides that feedback signal 557 to be combined with (for example, by scalar addition) the feed-forward correction signal 457 ($V_{k+1}^i$) to form the correction signal 559 ($W_{k+1}^i$) that is provided to the optical source 405. Because $U_{k+1}^i$ is determined from $X_{k+1}^i$ (which are states of components and/or conditions that are causes of wavelength error) and $U_k^i$ (the previously applied value of the feedback signal 557), application of the signal 559 ($W_{k+1}^i$), which includes $U_{k+1}^i$ and $V_{k+1}^i$ (the feed-forward correction signal for pulse k+1 of burst i) to the optical source 405 results in a beam that has a wavelength that is closer to the target wavelength and, thus, has a reduced wavelength error. In this manner, including the feedback path 502 with the feed-forward stabilization module 460 can further reduce the wavelength error.

Figure 6:
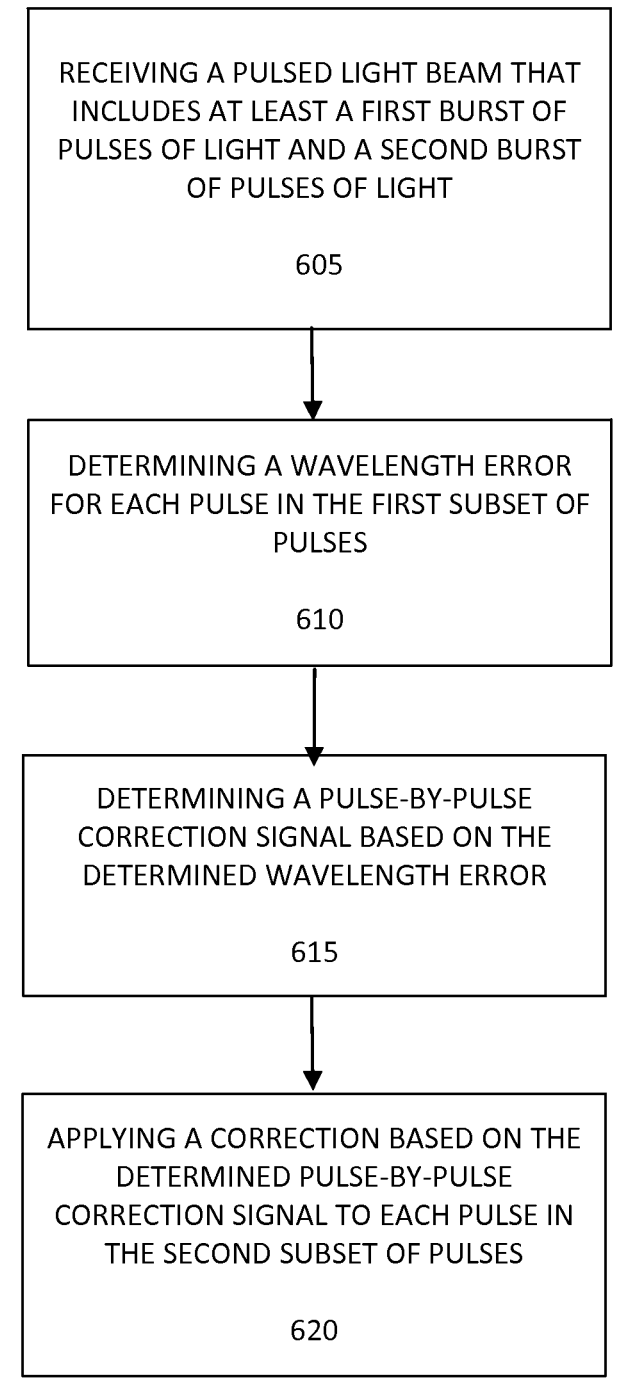
FIG. 6 is a flow chart of an exemplary process for compensating for wavelength error in a light beam.

Referring also to FIG. 6, a flowchart of an exemplary process 600 is shown. The process 600 can be used to compensate for wavelength variations in a light beam produced by a light source. The process 600 can be used to compensate for the wavelength variations caused by a repeatable disturbance that occurs in the bursts of light produced by the light source. An example of a repeatable disturbance is a physical event that occurs with the production of each burst, such as, for example, disturbances that arise from the production of the burst itself. Such a disturbance manifests in a similar way in each burst for same operating conditions and is thus, slowly varying or invariant burst-to-burst and can be compensated in a feed-forward manner.

The process 600 is discussed with reference to the control system 450, the feed-forward stabilization module 460, and the light source 405. However, other implementations are possible. For example, the process 600 can be performed by one or more electronic processors in the control system 150 or the control system 250. Additionally, in implementations in which the process 600 also includes feedback aspects, the process 600 can be performed by a control system that includes both feedback and feed-forward paths, such as the control system 550 of FIGS. 5A and 5B.

In some implementations, the process 600 is performed by one or more electronic processors that are part of a control system such as any of the control systems 150, 250, 450, and 550. In some implementations, the process 600 is performed by distributed electronic processors, such as processors that are part of more than one subsystem of the light source 102 or 205. For example, portions of the process 600 can be performed by one or more electronic processors of a separate control system that is connected to communicate with only the light source 105 or the light source 205 while other portions are performed by one or more electronic processors of the control system 150 or 250, respectively. Furthermore, the process 600 can be implemented as machine-readable and executable instructions and stored on a computer-readable medium, such that the process 600 can be installed onto an existing controller or control system of a light source as an upgrade or retrofit.

A light beam is received (605). The light beam has a non-zero wavelength error caused by a disturbance that is repeatable or invariant burst-to-burst. The light beam can be received at the line center analysis module 420 or another module that measures, monitors, determines, and/or accesses a value of the wavelength of a pulse in the pulsed light beam. The light beam can be the pulsed light beam 424 produced by the light source 405 (FIG. 4A). The light beam can be produced by an excimer laser, or a pulsed light beam from an optical source that is not a laser.

The light beam includes at least a first burst of pulses of light and a second burst of pulses of light. Each of the first and second bursts of pulses can include hundreds of pulses, for example, 100-400 pulses. The first burst of pulses includes a first subset of pulses, and the second burst of pulses includes a second subset of pulses. The first and second subsets of pulses can include all or a portion of the pulses in the first and second bursts, respectively. The pulses in a subset of pulses can be pulses that are sequential or non-sequential pulses in the burst, or a combination of sequential or non-sequential pulses. In other words, the pulses in any given subset of pulses can include any of the pulses of light that are in the burst. The pulses in the first subset of pulses and the pulses in the second subset of pulses can correspond to the same pulses in their respective bursts. For example, in these implementations, if the first subset of pulses includes pulses 1-10 (the first ten pulses of light) of the first burst then the second subset of pulses includes pulses 1-10 (the first ten pulses of light) of the second burst.

As discussed below with respect to FIGS. 7A-7D and 8A-8D, a disturbance can cause a transient wavelength error with a repeatable profile, the magnitude of the error being the greatest for the pulses that occur at the beginning of a burst and reduces over time such that the pulses occurring later in the burst have a smaller wavelength error. Thus, in some implementations, the first and second subset of pulses can include the first (or initial) N pulses of the first and second bursts, respectively. In these implementations, N can be any integer value. For example, N can be 60, and, in this example, the first subset of pulses and the second subset of pulses each include the first 60 sequential pulses of light in their respective bursts. In some examples N is a value between 20 and 60.

The first and second burst of pulses are separated in time, with the first burst of pulses being received prior in time to the second burst of pulses. Between the time that the first burst ends and the second burst begins, the pulsed light beam has a temporal period in which the beam does not include light. The first burst of pulses of light and the second burst of pulses of light can be consecutive bursts, or the first and second bursts can be separated in time by one or more intervening bursts of pulses of light that occur after the first burst of pulses of light but before the second burst of pulses of light.

The wavelength error is determined for each pulse in the first subset of pulses (610). The wavelength error for a particular pulse of light is the difference between the target wavelength and the determined wavelength for that pulse. The determined wavelength can be measured by the line center analysis module 420 and provided to the control system 450, or the control system 450 may determine the wavelength error from wavelength measurements obtained by the line center analysis module 420. The determined wavelength error is stored in the electronic storage 461 for use in determining a pulse-by-pulse correction signal to correct wavelength error of pulses in a subsequent burst of pulses.

A pulse-by-pulse correction signal is determined based on the determined wavelength error for the first subset of pulses (615). The pulse-by-pulse correction signal is also referred to as a feed-forward correction signal because the pulse-by-pulse correction signal is applied to the pulses of a later-occurring burst (the pulses of the second burst in this example). The pulse-by-pulse correction signal can be determined by providing the wavelength error determined from the pulses of an earlier burst to the feed-forward stabilization module 460. The pulse-by-pulse correction signal includes a value for each pulse in the second subset of pulses. For a burst i, the pulse-by-pulse correction signal or the feed-forward correction signal is represented as $(V_{k, k+1, \ldots, k+n}^{i-1})$. Each value of the correction signal $(V_k^i)$ represents a quality or quantity that is a prediction of a signal that would, when applied to the pulse of light k in the burst i, modify the wavelength of the pulse of light k such that the wavelength of the pulse of light k equals the target wavelength or is closer to the target wavelength than if the correction had not been applied. In other words, the feed-forward correction signal $(V_k^i)$ reduces the wavelength error of pulse k of burst i.

A correction based on the determined pulse-by-pulse correction signal is applied to each pulse in the second subset of pulses, which are included in the second burst (620). Application of the correction to any one of the pulses in the second subset of pulses reduces the wavelength error of the pulses in the second subset of pulses. The correction is determined from the wavelength error of pulses that are part of one burst of pulses (the first subset of pulses in this example), and the correction is applied to the pulses that are part of another burst of pulses (the second subset of pulses in this example). In this manner, the correction can be synthesized without detailed knowledge of the functioning of the light source. Additionally, by being applied to a subset of pulses in a later-occurring burst, the correction is feed-forward in nature. As such, determination of the correction is independent of delays in determining the wavelength that can occur in the line center analysis module 420. This allows the process 600 to be used with high-repetition light sources, such as those that operate at 6000 Hz and greater.

The pulse-by-pulse correction signal can be used, for example, by the electronic processor 452 in the control system 450 to generate a voltage signal that represents the value of the correction signal. In this example, the correction is the application of the voltage signal to the actuator 444. Applying the voltage signal to the actuator 444 causes the optical element 442 to move by an amount that causes deflection of a pulse in the second subset of pulses by an amount that compensates for the measured wavelength error of a corresponding pulse in the first subset of pulses. As discussed above, the wavelength error can arise from a physical disturbance that causes pressure fronts in the gain medium 419. Moving the optical element 442 can deflect the light that propagates in the chamber by an amount that counters the deflection of the light by the pressure fronts. In some implementations, the pulse-by-pulse correction signal can be added to or otherwise combined with a feedback or control signal that acts on the actuator 444 to move or adjust the optical element 442 to modify the beam in the chamber 214 for compensation or modification other than wavelength error reduction. In these implementations, the reduction in wavelength error is in addition to existing compensation or modification techniques and enhances and adds to these other techniques.

In some implementations, a low-pass filter (such as the low-pass filter module 464) is applied to the pulse-by-pulse correction signal prior to applying the correction to the pulses in the second set of pulses. As discussed above, without correction, the wavelength error is invariant or slowly varying between bursts of pulses. The low-pass filter rejects high frequency wavelength errors, for example, caused by noise, vibration or an unexpected motion of the light source 405, and could produce inaccurate pulse-by-pulse correction signals and inaccurate corrections.

The low-pass filter can be implemented as software that filters a digitized version of the pulse-by-pulse correction signal and is executed by the electronic processor 452 of the control system 450. In other implementations, the low-pass filter can be a collection of electronic components (such as a resistors and capacitors) that act on an analog version of the correction signal. In some implementations, the low-pass filter is applied to the correction signal during a time between two bursts of pulses of light.

Additionally, in some implementations, after the correction is applied to each pulse in the second subset of the second burst of pulses, the wavelength error for the pulses in the second subset is compared to an upper bound and a lower bound. If the wavelength error for a threshold number of pulses is greater than the upper bound or less than the lower bound, then a pulse-by-pulse correction signal is determined from the wavelength error. If there are fewer than the threshold number of pulses having a wavelength error above the upper bound and below the lower bound, then, in some implementations, a pulse-by-pulse correction signal is not determined from the wavelength error or the pulse-by-pulse correction signal is set to a pre-determined value (such as zero).

The example discussed above involves applying a correction to a single subsequent burst. However, the pulse-by-pulse correction signal can be applied to a plurality of subsequent bursts. Additionally, the process 600 can be performed repeatedly to progressively and iteratively reduce wavelength error over the course of operation of the light source 405.

Referring also to FIGS. 7A-7D and FIGS. 8A-8D, an example of the process 600 progressively and iteratively reducing the wavelength error of pulses emitted in bursts 801A-801D from a light source is shown. FIGS. 8A-8D show the wavelength error as a function of pulse number (k) for a subset of pulses in bursts 801A-801D, respectively. FIGS. 7A-7D show exemplary pulse-by-pulse correction signals 700A-700D, respectively, as a function of the pulse number (k). The pulse-by-pulse correction signals 700A-700D are examples of correction signals that are generated from the process 600. The burst 801A occurs first in time, followed by the bursts 801B and 801C, with the burst 801D occurring last in time. The light source can be any light source that emits a pulsed beam that includes bursts of pulses of light, such as any of the light sources 105, 205, and 405 discussed above.

In the example shown, a transient physical effect that occurs in the optical chamber causes a wavelength error that is most pronounced in the pulses that occur at the beginning of the burst. The wavelength error in this example can have the form of a second-order or third-order impulse response.

The pulse-by-pulse correction signals 700A-700D include a value for each pulse in the subset of pulses. As discussed below, the wavelength error of the pulses in the burst 801A is used by the process 600 to determine the pulse-by-pulse correction signal 700B, which in turn is applied to the pulses of the burst 801B. Thus, the example of FIGS. 7A-7D and 8A-8D illustrate feed-forward correction of wavelength error using the process 600.

Each wavelength error 800A-800D includes a wavelength error for each pulse in a subset of pulses in bursts 801A-801D, respectively. There are N pulses in the subsets of pulses of the bursts 801A-801D, with N being any integer value. The subsets of pulses can include all or fewer than all of the pulses in the respective bursts 801A-801D, with each subset including the same number of pulses. The bursts 801A-801D are sequentially occurring bursts in a light beam produced by a light source, such as the light source 405. The burst 801A occurs first and the burst 801D occurs last.

The wavelength error of each pulse in a subset is shown as a solid circle in FIGS. 8A-8D. The correction signals 700A-700D include a value for each pulse in the subset of pulses of bursts 801A-801D, respectively. Application of a correction that is based on the correction signal 700B-700D to pulses in the subset of pulses in bursts 801B-801D, respectively, reduces the wavelength error of the pulses in the bursts 801B-801D, with the goal of reducing the wavelength error of all pulses in a subset to within a range of values that fall between a lower bound 802 and an upper bound 803. As shown in FIG. 8D, the wavelength error for all of the pulses in the subset of pulses of burst 801D is between the lower bound 802 and the upper bound 803. The upper and lower bounds 802, 803 are values of wavelength error. The upper and lower bound can be the wavelength error that is expected to occur even when no identifiable disturbance acts on the light source (a wavelength error that is small enough such that it cannot be reduced further) or can be the wavelength error that is not impacting the user of the light source. The upper and lower bounds are typically expressed as a wavelength. The upper and lower bounds can be, for example, +/−040 femtometers (fm) or less, for example. In some implementations, the upper and lower bounds can be between +/−20 fm to +/−100 fm.

The correction signal 700A is the initial value correction signal. The initial value for the correction signal can have any value. In the example shown, the correction signal 700A has a value of zero for all pulses in the subset of pulses of the burst 801A. Thus, applying the correction signal 700A to the actuator 444 does not move the optical element 442 and does not affect the deflection (or wavelength) of the pulses in the subset of pulses of the burst 801A. FIG. 8A shows the wavelength error 800A for a subset of pulses in the burst 801A after the correction signal 700A is applied to the actuator 444.

The wavelength error 800A is used to determine the correction signal 700B (FIG. 7B). The correction signal 700B includes a value for each pulse in a subset of the pulses in the burst 801B. The values are such that, when a correction that is determined from the correction signal 700B is applied to the actuator 444, the actuator 444 moves the optical element 442 by an amount to cancel or compensate for the physical effect that causes the wavelength error in each pulse in the subset of the burst 801B. As shown in FIG. 7B, the value of the correction signal 700B can vary for the pulses in the subset. Thus, a different correction can be applied to each pulse in the subset. For example, the optical element 442 can move a different amount prior to interacting with the various pulses in the subset of pulses of the burst 801B so that each pulse in the subset can be deflected by a different amount.

Further, FIG. 7B illustrates an example of the process 600 determining that the transient that caused the wavelength error has ended. The end of the transient can be determined, for example, by detecting the first pulse in a series of M (any positive integer value) pulses that extend to the end of the subset of pulses and have a wavelength error between the lower bound 802 and the upper bound 803. Referring again to FIG. 7A, pulse 804 is the first pulse in a series of pulses that have a wavelength error between the bounds 802 and 803. The series of pulses extends from the pulse 804 to the end of the subset of pulses. Thus, the end of the transient is detected at pulse 804 and the correction corresponding to pulse 804 and subsequent pulses in the correction signal 700B is set to zero. In some implementations, the number of pulses in a burst may be counted, and the end of the transient can be pre-set to a fixed number of pulses after the first pulse in the burst based on a physical understanding of the light source.

Because the effect of the disturbance on wavelength error is slowly varying burst-to-burst, applying the correction signal 700B, which is determined based on the wavelength error of the burst 801A, to the pulses of the burst 801B reduces the size of the wavelength error in the pulses of the burst 801B as compared to the pulses in the burst 801A. Additionally, a greater number of pulses in the burst 801B have a wavelength error within the range defined by the minimum bound 802 and the maximum bound 803.

The wavelength error 800B is used with the process 600 to determine another correction signal 700C, which is used to determine a voltage to apply to the actuator 444 as the optical element 442 interacts with the pulses of the subsequent burst 801C. FIG. 8C shows the wavelength error 800C of the pulses of the burst of pulses 801C that interacted with the optical element 442 that was adjusted based on the correction signal 700C. The wavelength error 800C is lower than the wavelength error 800A and 800B because the process 600 is iteratively learning the characteristics of the wavelength error caused by the disturbance and progressively improving the performance of the pulse-by-pulse correction with each subsequent burst.

Similarly, the wavelength error 800C is used to determine a correction signal 700D. The correction signal 700D is used to generate voltages that are applied to the actuator 444 as the pulses of the subsequent burst 801D interact with the optical element 442. The wavelength error 800D of the pulses in the burst 801D of pulses is reduced compared to the wavelength errors 800A-800C. Additionally, all of the pulses in the subset of pulses in the burst 801D are between the upper bound 803 and the lower bound 802.

Thus, in this example, the process 600 reduced the wavelength error to within an acceptable range after four bursts of pulses. When all of the pulses in a subset have a wavelength error within the acceptable range, the process 600 can end. In some implementations, the process 600 continues despite the occurrence of a burst with pulses having a wavelength error within the acceptable range. The process 600 can be applied to all or fewer than all of the bursts of pulses that are produced by the light source 405. Although the example above shows the process 600 reducing the wavelength error to within an acceptable range after four bursts of pulses, in other examples, the wavelength error can be reduced to an acceptable range after fewer or more bursts. For example, the wavelength error can be reduced to an acceptable range after between 2 and 100 bursts. The number of bursts that occur prior to the wavelength error being reduced to an acceptable range depends on how much variation there is in the wavelength error between bursts and the acceptable range of wavelength error. A light beam with a higher or greater about of variation in wavelength error burst-to-burst and/or a lower acceptable range of variation in wavelength error can result in a higher number of bursts occurring prior to the wavelength error being reduced to within the acceptable range.

When the wavelength error is not reduced to the acceptable range within a threshold number of bursts of pulses, the assumption of the wavelength error being invariant or slowly varying burst-to-burst may be inaccurate. If the wavelength error is not within the acceptable range by the threshold number of bursts, the process 600 can be determined to be not converging. In this instance, the pulse-by-pulse correction signal may be inaccurate and corrections based on the pulse-by-pulse correction signal can be set to zero or some other value to indicate to the control system 450 that the correction based on the pulse-by-pulse correction signal is not to be used. Thus, the correction based on the pulse-by-pulse correction signal does not degrade the baseline performance of the light source 405 in conditions in which the process 600 is inapplicable.

In this manner, the characteristics (such as the shape, magnitude, and/or duration) of a transient wavelength error that arises from a repeatable physical disturbance are learned during operation of the light source 405 and without having prior knowledge of the light source 405 or the operating conditions. By learning the characteristics of the transient wavelength error, the process 600 corrects and/or compensates for the wavelength error in a feed-forward manner. Additionally, because the correction signals 700B-700D are determined at multiple times during operation of the light source 405, variations in the shape and duration of the transient wavelength error that occur during operation due to changes in, for example, the firing pattern of the electrodes 417, the temperature of the gain medium 419 can be compensated for.

Additionally, in the example of FIGS. 7A-7D and 8A-8D, the wavelength error of multiple bursts of pulses is accounted for in determining the correction signal 700D. However, in other examples, any of the correction signals 700B-700D can be determined from a single wavelength error. Further, the correction signals 700B-700D can be determined from a set of wavelength errors. Additionally, the correction signals 700B-700D can be based on wavelength errors that are from a burst other than the immediately preceding burst. For example, in some implementations the correction signal 700D can be determined from the wavelength error 800B.

Furthermore, although the example of applying a voltage to the actuator 444, which causes the motion of the optical element 442 is provided, the correction based on the determined pulse-by-pulse correction signal can take other forms. For example, the correction may be an electronic signal that is stored in the electronic storage 461 and provided to a controller that is coupled to the optical element 442. The correction can be any physical or electronic quantity or quality that causes a correction or change in the wavelength of the light beam produced by the light source 405.

Figure 9:
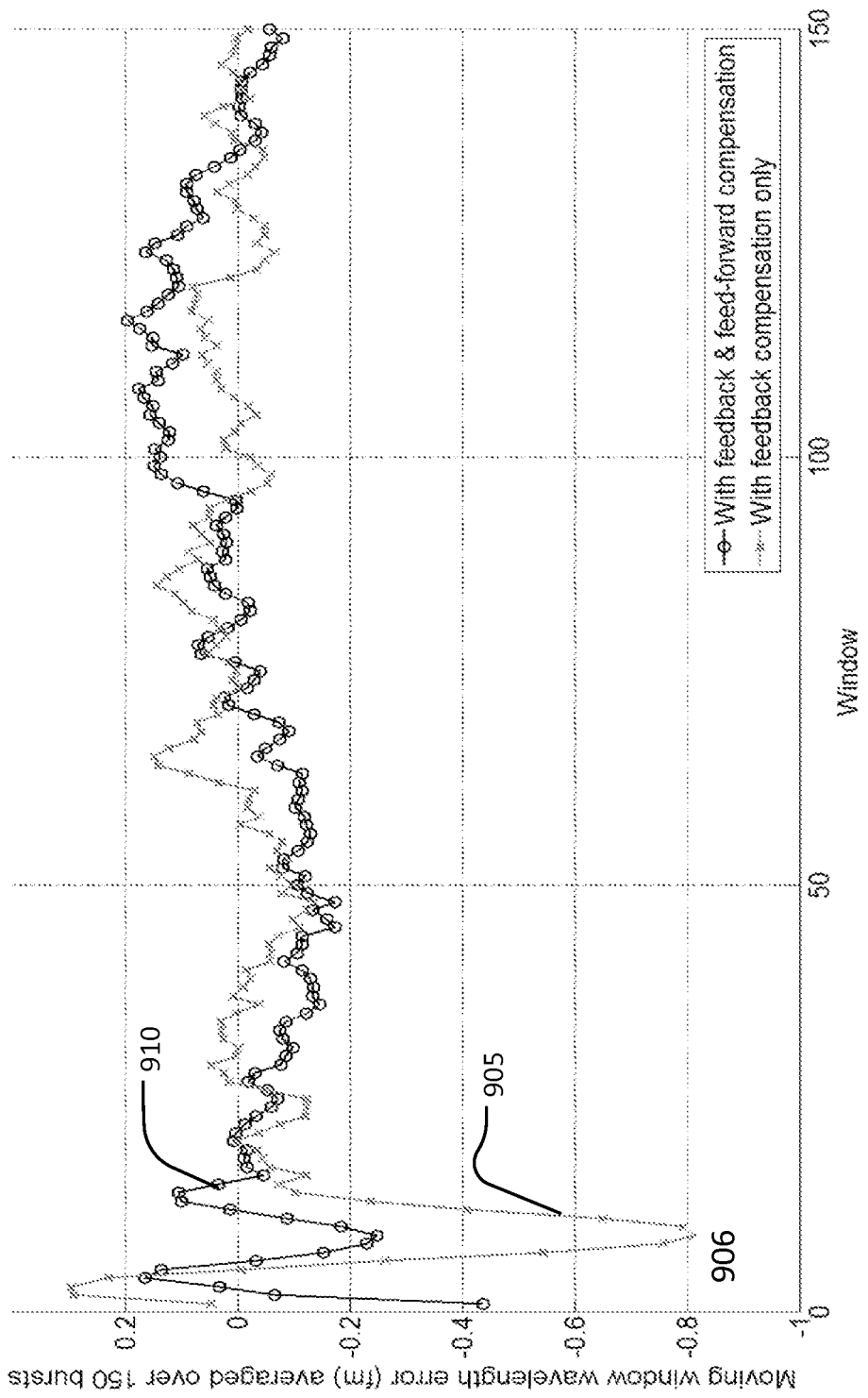
FIG. 9 is a plot of exemplary simulated wavelength error data for a laser.

FIG. 9 shows simulated data illustrating the effectiveness of the feed-forward compensation techniques discussed above with respect to, for example, FIGS. 5A, 5B, and 6. FIG. 9 shows curves 905 and 910 of moving window wavelength error in femtometers (fm) averaged over 150 bursts as a function of the moving window for a laser with a pulse repetition rate of 6000 Hz. In this example, each burst included 150 windows of pulses over which the wavelength error was averaged, with the lower number windows including the initial pulses in the burst and the higher number windows including the later pulses in the burst. Thus, the horizontal axis of FIG. 9 correlates with pulse number (k), and the vertical axis has a correlation with wavelength error.

The curve 905 shows the actual performance with feedback compensation but without the feed-forward wavelength error compensation. The curves 910 shows the simulated wavelength error after compensation with the feed-forward compensation.

With only feedback compensation, the moving window wavelength error is dominated by an initial burst transient 906. This initial burst transient 906 can be similar to the acoustic transients. It is believed that many feedback controllers are challenged to compensate for the transient 906 due to the high pulse repetition rate (6,000 Hz or greater) and processing delays in the line center analysis module that are on the order of 160 microseconds (µs). However, when used with the feedback wavelength controller, the feed-forward wavelength error technique (such as the feed-forward stabilization module 460) reduces the transient 906 by about a factor of 4.

Other implementations are within the scope of the following claims. For example, in some implementations, the master oscillator 212 (FIG. 2) is configured as a regenerative ring resonator. In these implementations, the seed light beam 224 is directed through the power amplifier 230 to form a circulating path or loop. In implementations in which the power amplifier 230 is a regenerative ring resonator, the seed light beam 224 is amplified by repeatedly passing through the discharge chamber 240. The optical system 232 provides a mechanism to in-couple the seed light beam 224 and to out-couple a portion of the amplified radiation from the ring resonator to form the output light beam 260. For example, the optical system 232 can include as the mechanism an optical coupler such as a partially-reflecting mirror that receives the seed light beam 224 and the amplified radiation from the ring resonator.

What is claimed is:

1. A method comprising:
receiving a pulsed light beam emitted from an optical source, the pulsed light beam comprising at least a first burst of pulses of light and a second burst of pulses of light, the first burst of pulses comprising a first subset of pulses and the second burst of pulses comprising a second subset of pulses;
determining a wavelength error for each pulse in the first subset of pulses;
determining a correction signal based on the determined wavelength error, the correction signal comprising a correction signal associated with each pulse in the first subset of pulses;
applying a correction based on the determined correction signal to each pulse in the second subset of pulses, wherein
the correction signal is determined during operation of the optical source and without prior knowledge of an operating condition of the optical source, and
applying the correction to a pulse in the second subset of pulses reduces the wavelength error of the pulse in the second subset of pulses;
after the correction is applied, determining whether the wavelength error of each pulse in the second subset of pulses is outside of a wavelength error range defined by an upper wavelength error bound and a lower wavelength error bound; and
if the wavelength error for more than a threshold number of pulses in the second subset of pulses is outside of the wavelength error range, determining a second correction signal based on the wavelength error of the second subset of pulses to apply to a subset of pulses in a subsequent burst of pulses, wherein
the wavelength error for any particular pulse is a difference between a wavelength of that particular pulse and a target wavelength.

2. The method of claim 1, wherein
determining a correction signal based on the determined wavelength error comprises determining a voltage signal for each pulse in the first burst of pulses, and
applying a correction to each pulse in the second subset of pulses comprises applying the voltage signal to an actuator coupled to an optical element that interacts with the pulses in the second subset of the pulses.

3. The method of claim 2, wherein, the optical element moves in response to applying the voltage signal to the actuator, thereby changing the wavelength of a pulse that interacts with the optical element.

4. The method of claim 2, further comprising:
determining a wavelength error of a plurality of pulses in the second burst of pulses of light;
accessing a model representing a secondary disturbance in the optical source;
accessing a model representing dynamics of the actuator; and
determining a another correction signal to apply to the second subset of pulses, the other correction signal based on the determined wavelength error of the plurality of pulses in the second burst of pulses of light and one or more of the model of the secondary disturbance and the model representing dynamics of the actuator, wherein applying a correction based on the determined correction signal to each pulse in the second subset of pulses further comprises applying the other correction signal to at least some of the pulses in the second subset of pulses.

5. The method of claim 4, wherein the correction based on the determined correction signal and the other correction signal are added prior to application to the pulses in the second subset of pulses.

6. The method of claim 1, wherein the first subset of pulses comprises fewer than all of the pulses of light of the first burst of pulses of light, and the second subset of pulses comprises fewer than all of the pulses of light of the second burst of pulses of light.

7. The method of claim 6, wherein the first subset of pulses comprises the initial N pulses in the first burst of pulses, and the second subset of pulses comprises the initial N pulses in the second burst of pulses.

8. The method of claim 1, further comprising filtering the determined correction signal by applying a low-pass filter to the determined correction signal, the low-pass filter comprising a filter that reduces portions of the correction signal that are associated with a frequency greater than a frequency threshold.

9. The method of claim 1, further comprising filtering the determined correction signal by applying a low-pass filter to a determined wavelength error signal, the determined wavelength error signal comprising the wavelength error for each pulse in the first burst of pulses.

10. The method of claim 1, wherein the first burst of pulses of light and the second burst of pulses of light are separated by a temporal period, and the correction signal is determined during the temporal period.

11. The method of claim 10, wherein second burst of pulses of light occurs after the first burst of light, and the correction signal is determined only after the first burst of light occurs.

12. The method of claim 10, further comprising filtering the determined correction signal during the temporal period.

13. The method of claim 1, wherein one or more bursts occur between the first burst and the second burst such that the first burst and the second burst are non-consecutive in time.

14. The method of claim 1, wherein the first burst of pulses of light is the burst that immediately precedes the second burst of pulses of light in time.

15. The method of claim 1, further comprising determining the wavelength for each pulse in the first subset of pulses.

16. The method of claim 1, further comprising:
applying the second correction signal to a third subset of pulses in a third burst of pulses that occurs after the first burst of pulses and the second burst of pulses;
after applying the second correction signal, determining whether the wavelength error for the each pulse in the third burst of pulses is outside of the wavelength error range; and
if the wavelength error for more than the threshold number of pulses in the third subset of pulses is outside of the wavelength error range:
determining whether the third burst of pulses occurred after a threshold number of bursts of pulses occurred;
determining a third correction signal if the third burst of pulses occurred before the threshold number of bursts of pulses occurred; and
if the third burst of pulses occurred after the threshold number of bursts occurred: (a) determining a correction signal that, when applied to any pulse in a subsequent burst, does not change the wavelength error of that pulse or (b) not determining a correction signal.

17. A method comprising:
receiving a pulsed light beam emitted from an optical source, the pulsed light beam comprising at least a first burst of pulses of light and a second burst of pulses of light, the first burst of pulses and the second burst of pulses being separated in time, and each of the first burst of pulses and the second burst of pulses comprising a transient wavelength error that varies with operating conditions;
determining a wavelength error for two or more pulses in the first burst of pulses;
determining the transient wavelength error in the first burst of pulses of light based on the determined wavelength error;
determining a correction signal based on the determined transient wavelength error;
applying a correction based on the correction signal to a second subset of pulses, the second subset of pulses being at least some of the pulses of the second burst of pulses of light, wherein the transient wavelength error is determined without prior knowledge of the operating condition of the optical source;
determining a wavelength error for each of the pulses in the second subset of pulses after applying the correction;
determining whether any of the pulses in the second subset of pulses have a wavelength error outside of a range defined by an upper wavelength error bound and a lower wavelength error bound; and
determining whether the transient wavelength error is substantially invariant between the first burst of pulses and the second burst of pulses based on the determination of whether any of the pulses in the second subset of pulses have a wavelength error outside of the range.

18. The method of claim 17, wherein the transient wavelength error that varies with operating conditions is a transient wavelength error that is substantially invariant among bursts of pulses produced under a given set of operating conditions.

19. The method of claim 17, wherein the transient wavelength error arises from an acoustic event within a chamber of the optical source that emits the pulsed light beam.

20. The method of claim 17, wherein the transient wavelength error is characterized by an impulse response of a second or third order system.

21. The method of claim 17, wherein the first subset of pulses comprises fewer than all of the pulses in the first burst of pulses of light, and the second subset of pulses comprises fewer than all of the pulses in the second burst of pulses of light.

22. The method of claim 17, wherein determining the transient wavelength error comprises determining one or more the characteristics of the transient wavelength error, the one or more characteristics comprising one or more of a shape, magnitude, and duration.

23. The method of claim 22, wherein the determined one or more characteristics of the transient wavelength change to account for changes in the operating conditions of the optical source without knowledge of changes in the operating conditions of the optical source.

24. The method of claim 17, wherein the operating condition comprises one or more of repetition rate, a change in the firing pattern of the pulses produced by the optical source, and a temperature of a gain medium of the optical source.

25. The method of claim 17, wherein the one or more characteristics of the transient wavelength error are determined continuously during operation of the optical source and without prior knowledge of the physical geometry of the optical source.

26. A controller for an optical source that emits a pulsed light beam, the controller configured to couple to the optical source, and the controller comprising:
one or more electronic processors; and
a non-transitory, computer-readable storage medium coupled to one or more of the one or more electronic processors, the computer-readable storage medium having stored thereon instructions, which, when executed by the one or more electronic processors, causes the one or more processors to:
access information of a pulsed light beam emitted from the optical source, the pulsed light beam comprising at least a first burst of pulses of light and a second burst of pulses of light, the first burst of pulses comprising a first subset of pulses and the second burst of pulses comprising a second subset of pulses;
determine a wavelength error for each pulse in the first subset of pulses;
determine a correction signal based on the determined wavelength error, the correction signal comprising a correction signal associated with each pulse in the first subset of pulses; and
apply a correction based on the determined correction signal to each pulse in the second subset of pulses, wherein
the correction signal is determined during operation of the optical source and without prior knowledge of an operating condition of the optical source; and
applying the correction to a pulse in the second subset of pulses reduces the wavelength error of the pulse;
after the correction is applied, determine whether the wavelength error of each pulse in the second subset of pulses is outside of a wavelength error range defined by an upper wavelength error bound and a lower wavelength error bound; and
if the wavelength error for more than a threshold number of pulses in the second subset of pulses is outside of the wavelength error range, determine a second correction signal based on the wavelength error of the second subset of pulses to apply to a subset of pulses in a subsequent burst of pulses, wherein
the wavelength error for any particular pulse is a difference between a wavelength of that particular pulse and a target wavelength.

27. A light system comprising:
an optical source configured to emit a beam of light, the beam of light comprising bursts separated by temporal periods, each burst comprising pulses of light that occur at a temporal repetition rate;
a line center analysis module configured to measure a wavelength of the pulses of light in the bursts of light; and
a controller configured to receive the measurement of the wavelength at the temporal repetition rate, the controller comprising:
a feedback module configured to determine a feedback correction signal to compensate for wavelength error of a subset of pulses in a first burst of pulses;
a feed-forward stabilization module configured to determine a feed-forward correction signal to compensate for wavelength error of the subset of pulses in the first burst of pulses;
one or more electronic processors coupled to a non-transitory computer readable medium comprising instructions that, when executed, cause the one or more electronic processors to:
access a feedback correction signal comprising a feedback correction for each of the pulses in the subset of pulses and a feed-forward correction signal comprising a feed-forward correction for each of the pulses in the subset of pulses;
combine the feed-forward correction and the feedback correction for each pulse in the subset of pulses to form a combined correction signal for the subset of pulses in the first burst of pulses, wherein the feed-forward correction signal for any particular pulse is based on a corresponding pulse in an earlier-occurring burst, and the feedback signal for any particular pulse is based on a wavelength error of an earlier-occurring pulse in the first burst;
provide the combined correction signal to the optical source to reduce the wavelength error of the subset of pulses in the first burst;
determine a wavelength error for each pulse in the subset of pulses in the first burst after the combined correction signal is provided to the optical source;
determine whether the wavelength error for each pulse in the subset of pulses in the first burst is within a wavelength error range defined by an upper wavelength error bound and a lower wavelength error bound; and
if more than a threshold number of pulses have a wavelength error outside of the wavelength error range, determine a combined correction signal for a subset of pulses in a subsequent burst of pulses.

28. The light system of claim 27, wherein the feed-forward stabilization module and the feedback module are separate modules and are independent of each other.

29. The light system of claim 27, wherein the wavelength error arises from a plurality of factors, and the feedback correction signal is configured to reduce the wavelength error arising from some of the plurality of factors, and the feed-forward correction signal is configured to reduce the wavelength error arising from others of the plurality of factors.

30. The light system of claim 29, wherein:
the feed-forward correction signal is configured to reduce wavelength error that arises from factors that are substantially invariant among the first burst and later-occurring bursts under a given set of operating conditions, and
the feedback correction signal is configured to reduce wavelength error that arises from factors that vary among bursts.

* * * * *